United States Patent
Hayashi

(10) Patent No.: US 10,225,110 B2
(45) Date of Patent: Mar. 5, 2019

(54) TRANSMISSION DEVICE, TRANSMISSION METHOD, AND COMMUNICATION SYSTEM

(71) Applicant: Sony Corporation, Tokyo (JP)

(72) Inventor: Hiroaki Hayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/063,439

(22) PCT Filed: Dec. 16, 2016

(86) PCT No.: PCT/JP2016/087588
§ 371 (c)(1),
(2) Date: Jun. 18, 2018

(87) PCT Pub. No.: WO2017/126267
PCT Pub. Date: Jul. 27, 2017

(65) Prior Publication Data
US 2019/0007239 A1    Jan. 3, 2019

(30) Foreign Application Priority Data

Jan. 22, 2016    (JP) .................................. 2016-010286

(51) Int. Cl.
*H04L 25/02* (2006.01)
*H04L 25/49* (2006.01)
*H03K 19/0175* (2006.01)
*H04B 3/04* (2006.01)
*H04L 29/08* (2006.01)

(52) U.S. Cl.
CPC ..... *H04L 25/0272* (2013.01); *H03K 19/0175* (2013.01); *H04B 3/04* (2013.01); *H04L 25/0278* (2013.01); *H04L 25/028* (2013.01); *H04L 29/08* (2013.01)

(58) Field of Classification Search
CPC . H04L 25/0272; H04L 25/0278; H04L 29/08; H04L 25/028; H04B 3/04; H03K 19/0175
USPC ...................................................... 326/83, 30
See application file for complete search history.

(56) References Cited

U.S. PATENT DOCUMENTS

| | | | | |
|---|---|---|---|---|
| 4,697,107 A * | 9/1987 | Haines | ............ | H03K 19/09429 326/58 |
| 8,064,535 B2 | 11/2011 | Wiley | | |
| 8,106,676 B2 * | 1/2012 | Kaiwa | .................. | G11C 7/1051 326/26 |

(Continued)

FOREIGN PATENT DOCUMENTS

| | | |
|---|---|---|
| JP | 06-261092 A | 9/1994 |
| JP | 2007-166059 A | 6/2007 |
| JP | 2009-284427 A | 12/2009 |

(Continued)

*Primary Examiner* — Daniel D Chang
(74) *Attorney, Agent, or Firm* — Michael Best & Friedrich LLP

(57) ABSTRACT

A transmission device according to the disclosure includes a first driver section and a setting section. The first driver section selectively sets a voltage at a first output terminal to one of a first voltage, a second voltage, and a third voltage that is between the first voltage and the second voltage. The setting section dynamically sets an output impedance of the first driver section at a time when the first driver section sets the voltage at the first output terminal to the third voltage.

17 Claims, 23 Drawing Sheets

(56) References Cited

U.S. PATENT DOCUMENTS

2012/0326746 A1* 12/2012 McCall ................ G11C 7/1045
326/30

FOREIGN PATENT DOCUMENTS

| JP | 2009-296568 A | 12/2009 |
| JP | 2017-038212 A | 2/2017 |

* cited by examiner

[FIG. 1]
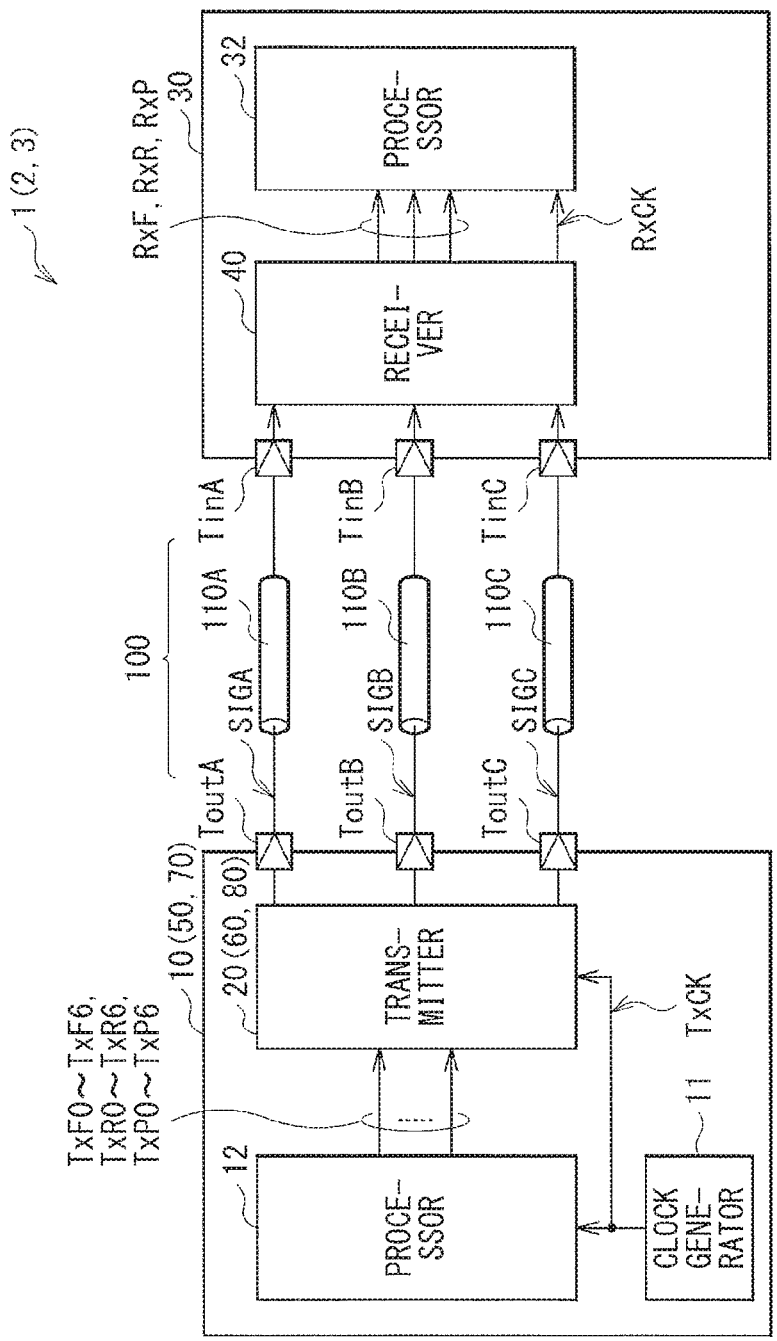

[FIG. 2]
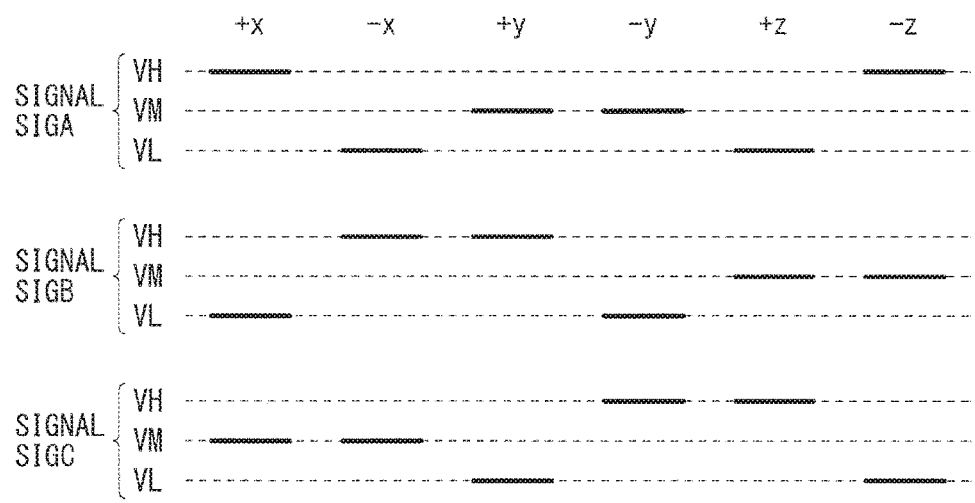
[FIG. 3]
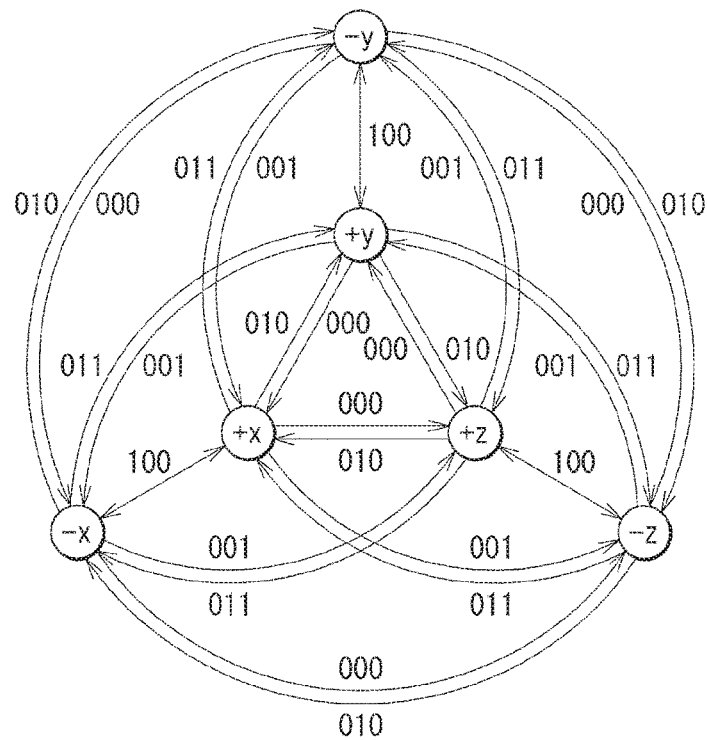

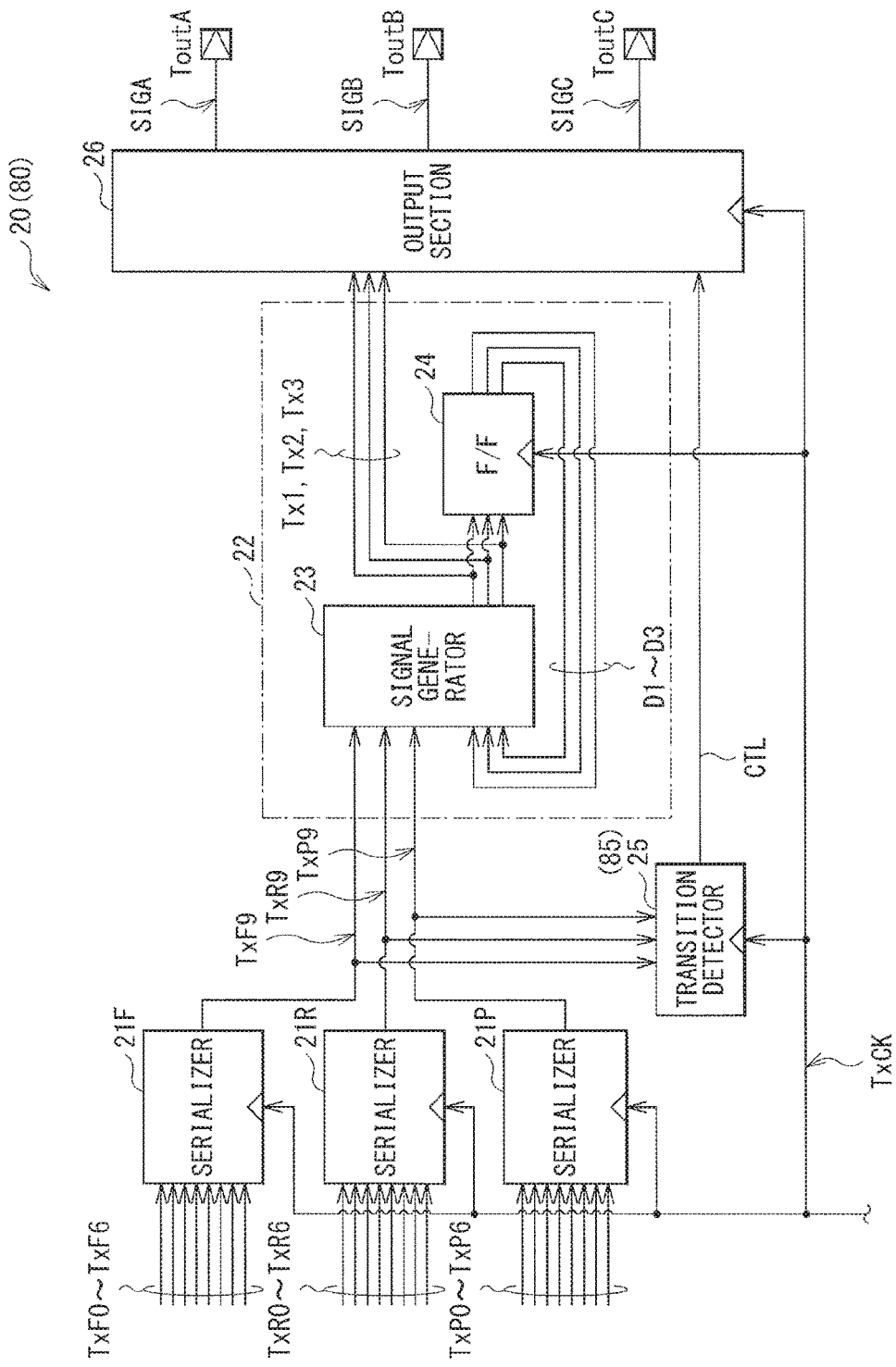
[FIG. 4]

[ FIG. 5 ]

| TxF9, TxR9, TxP9 | DS=+x | DS=-x | DS=+y | DS=-y | DS=+z | DS=-z |
|---|---|---|---|---|---|---|
| 000 | +z | -z | +x | -x | +y | -y |
| 001 | -z | +z | -x | +x | -y | +y |
| 010 | +y | -y | +z | -z | +x | -x |
| 011 | -y | +y | -z | +z | -x | +x |
| 1xx | -x | +x | -y | +y | -z | +z |

| SYMBOL | SYMBOL SIGNAL Tx1 | SYMBOL SIGNAL Tx2 | SYMBOL SIGNAL Tx3 | SIGNAL PUA | SIGNAL PDA | SIGNAL PUB | SIGNAL PDB | SIGNAL PUC | SIGNAL PDC | SIGNAL SIGA | SIGNAL SIGB | SIGNAL SIGC |
|---|---|---|---|---|---|---|---|---|---|---|---|---|
| +x | 1 | 0 | 0 | 1 | 0 | 0 | 1 | 1 | 1 | VH | VL | VM |
| −x | 0 | 1 | 1 | 0 | 1 | 1 | 0 | 1 | 1 | VL | VH | VM |
| +y | 0 | 1 | 0 | 1 | 1 | 1 | 0 | 0 | 1 | VM | VH | VL |
| −y | 1 | 0 | 1 | 1 | 1 | 0 | 1 | 1 | 0 | VM | VL | VH |
| +z | 0 | 0 | 1 | 0 | 0 | 1 | 1 | 1 | 0 | VL | VM | VH |
| −z | 1 | 1 | 0 | 1 | 1 | 1 | 1 | 0 | 1 | VH | VM | VL |

[FIG.7]
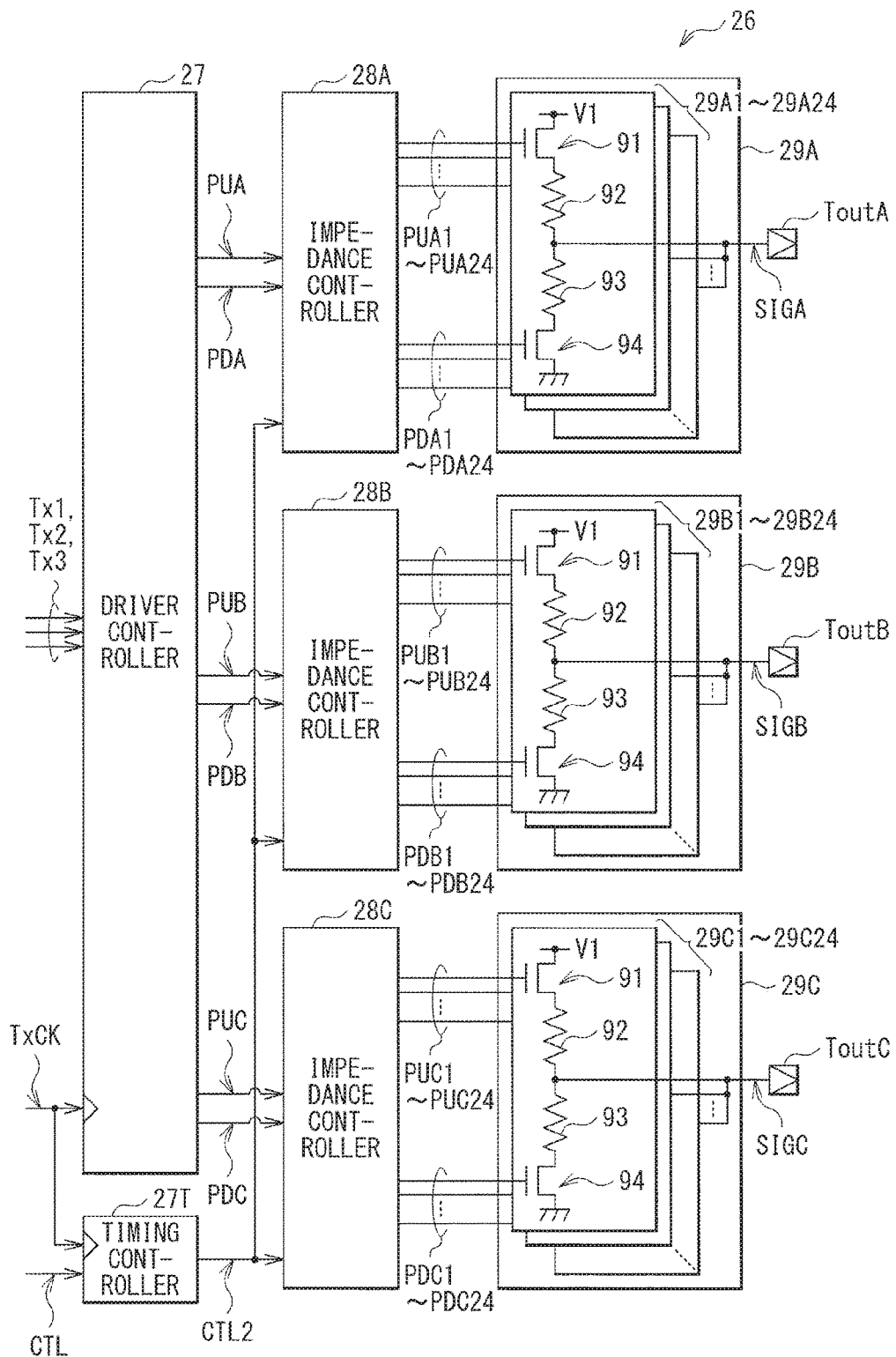

[ FIG. 8 ]
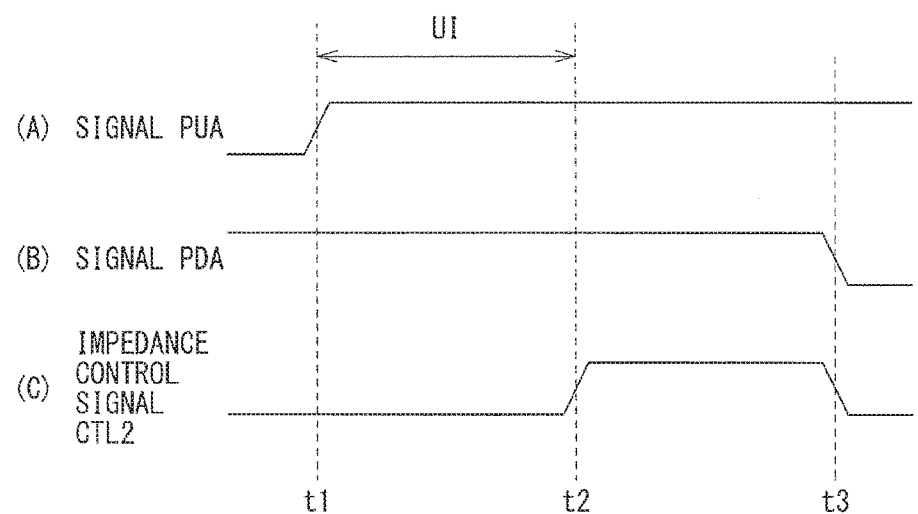

[ FIG. 9 ]
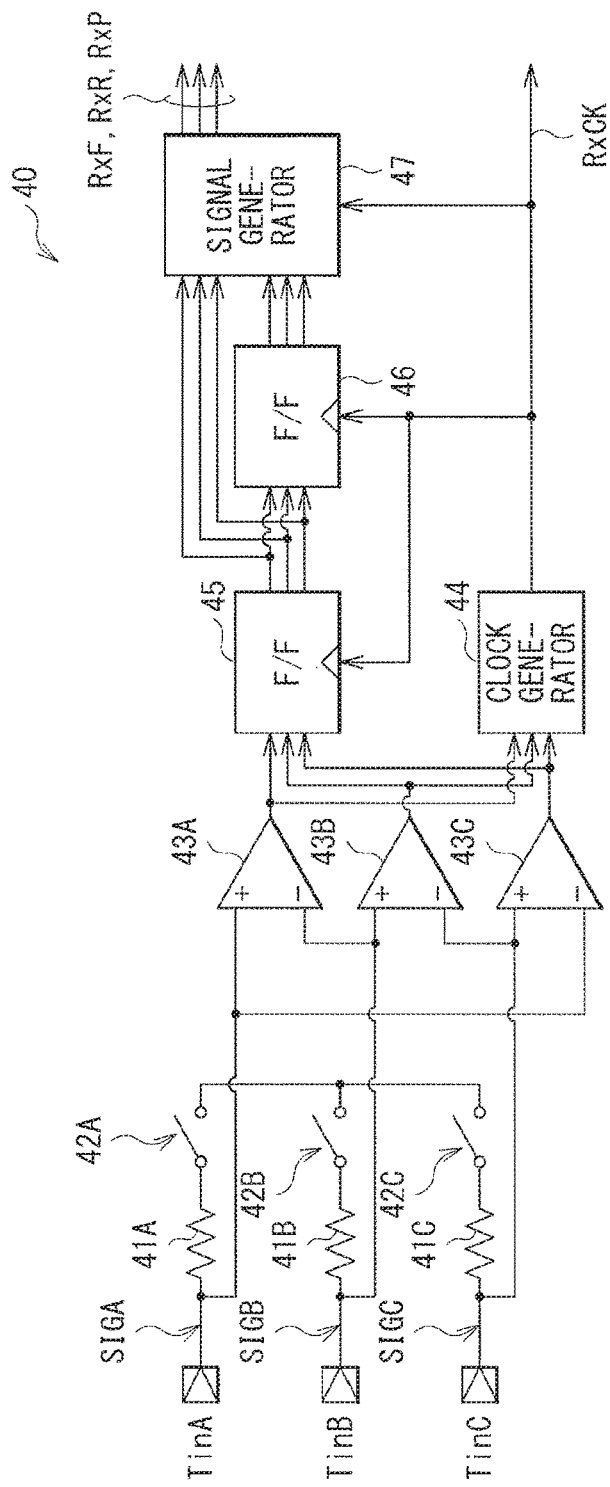

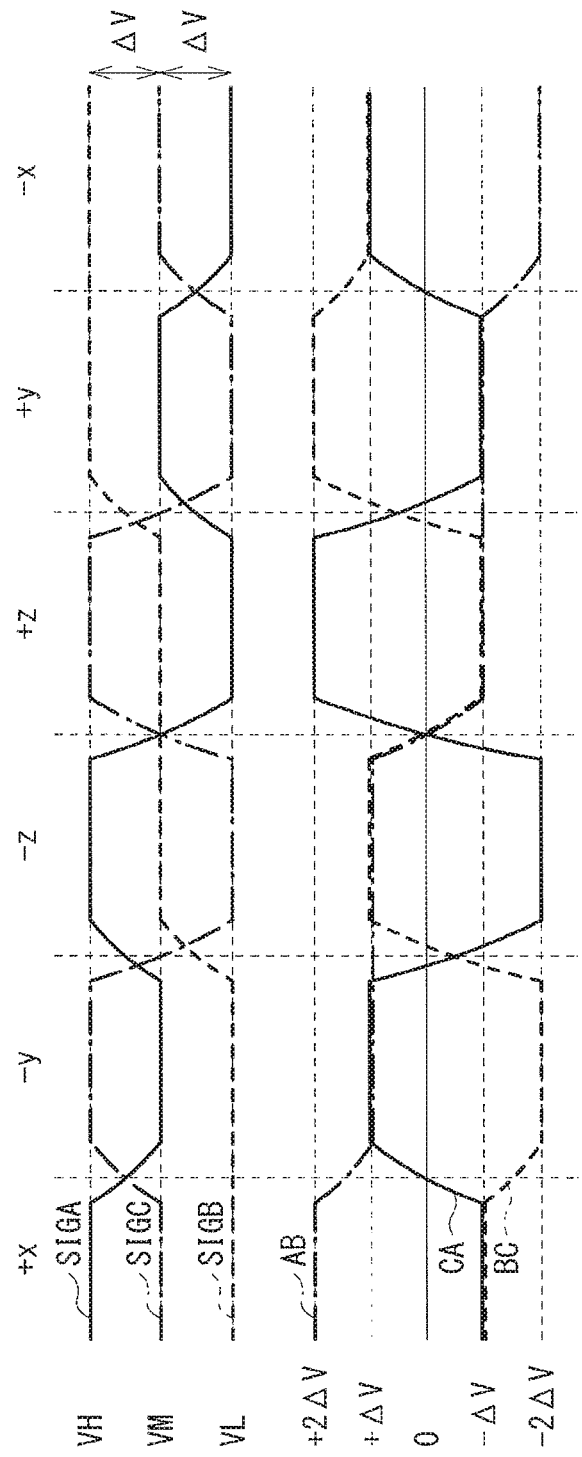
[ FIG. 10 ]

[ FIG. 11A ]
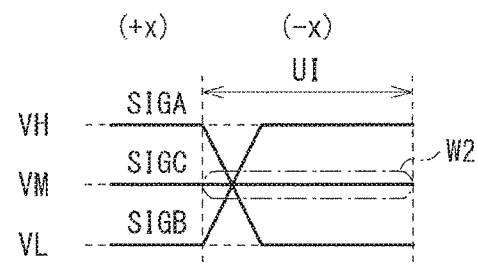
[ FIG. 11B ]
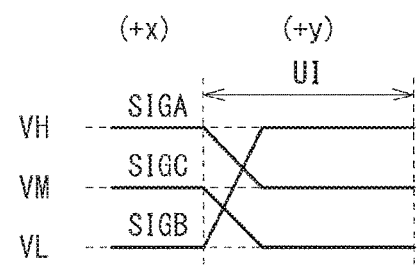
[ FIG. 11C ]
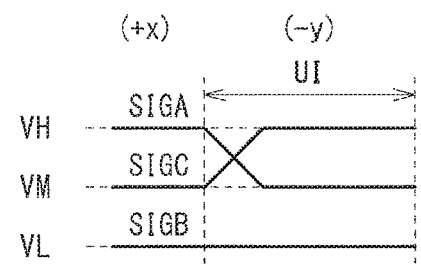
[ FIG. 11D ]
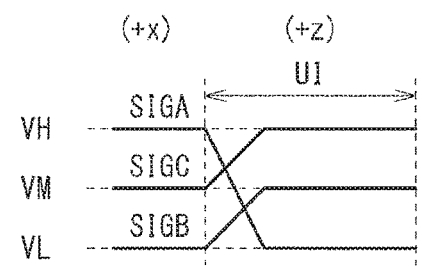
[ FIG. 11E ]
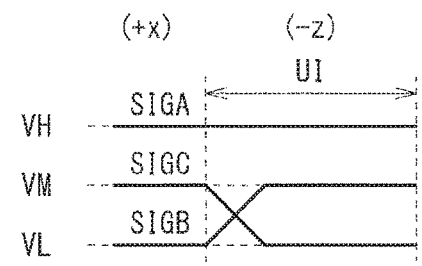

[ FIG. 12 ]
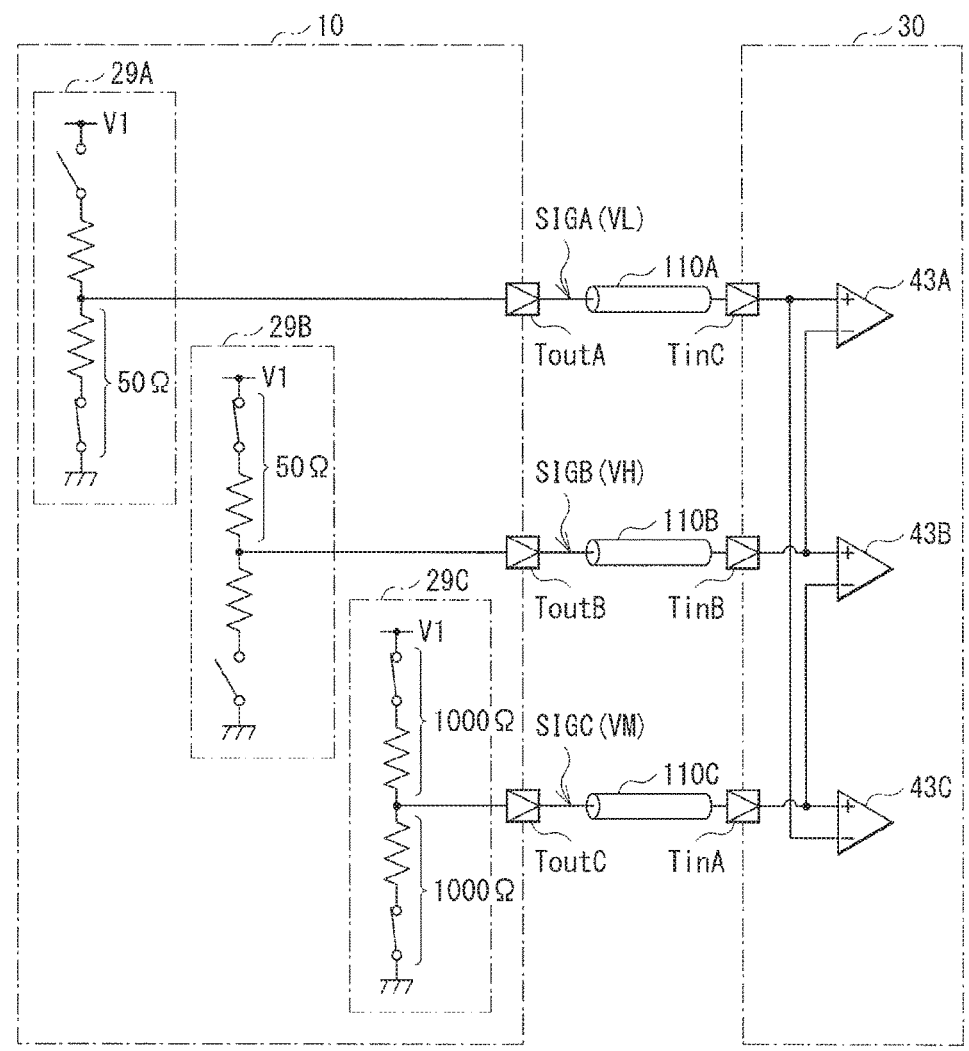

[ FIG. 13A ]
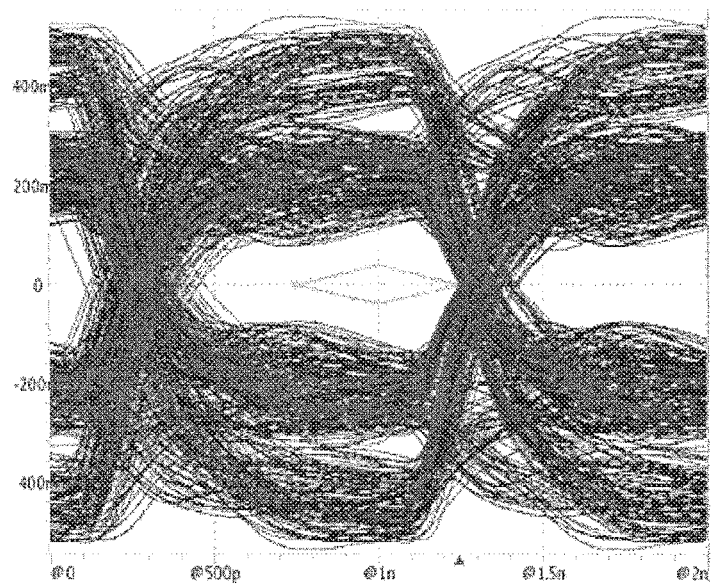
[ FIG. 13B ]
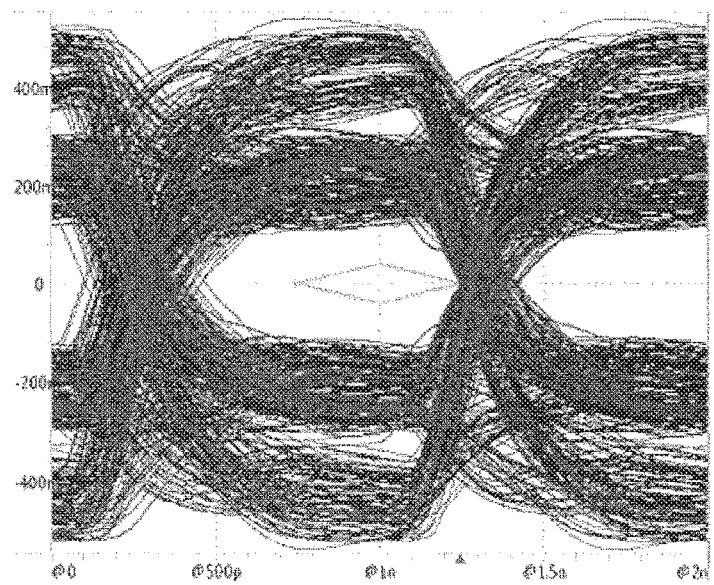

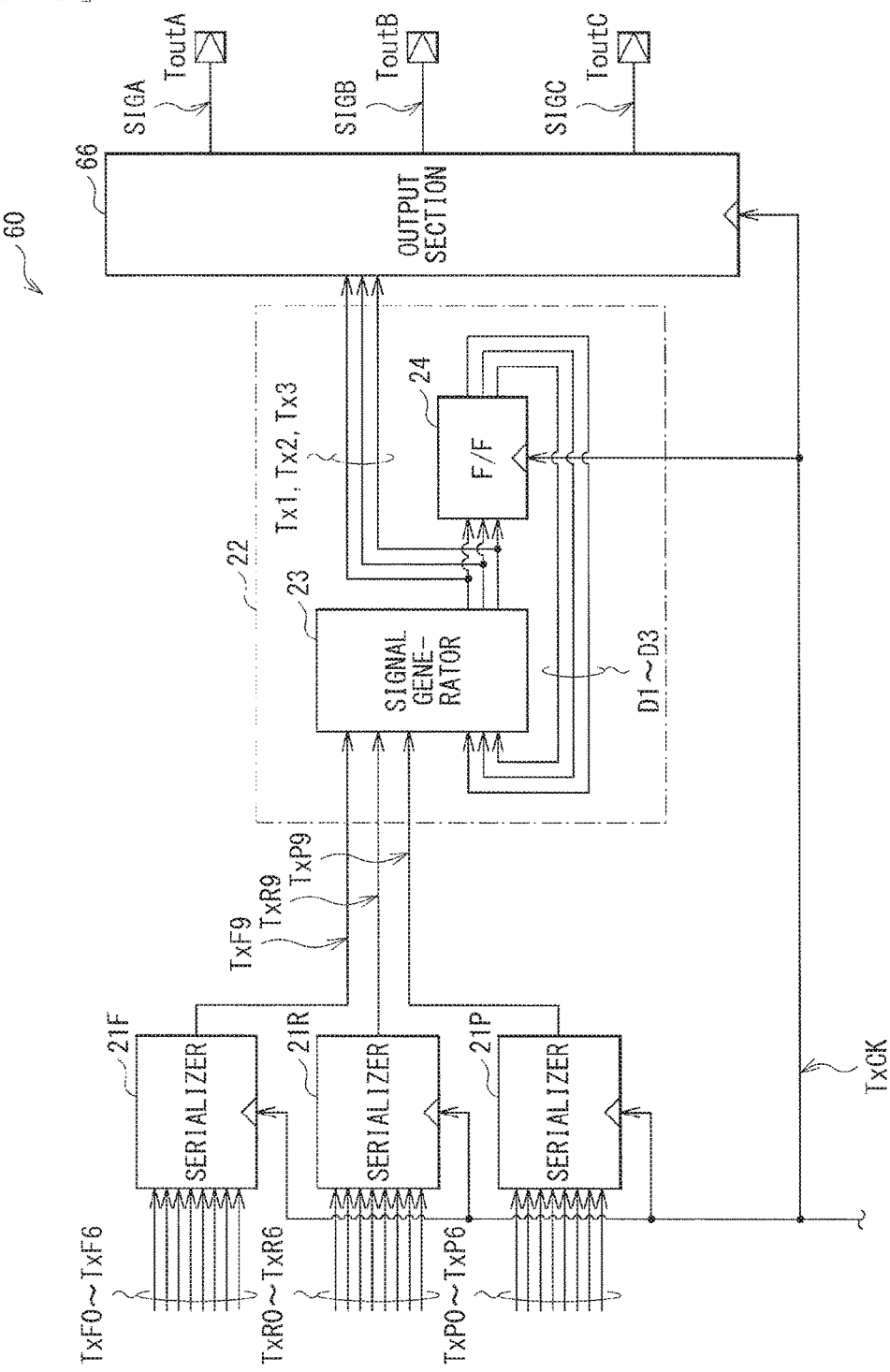
[FIG. 14]

[ FIG. 15 ]
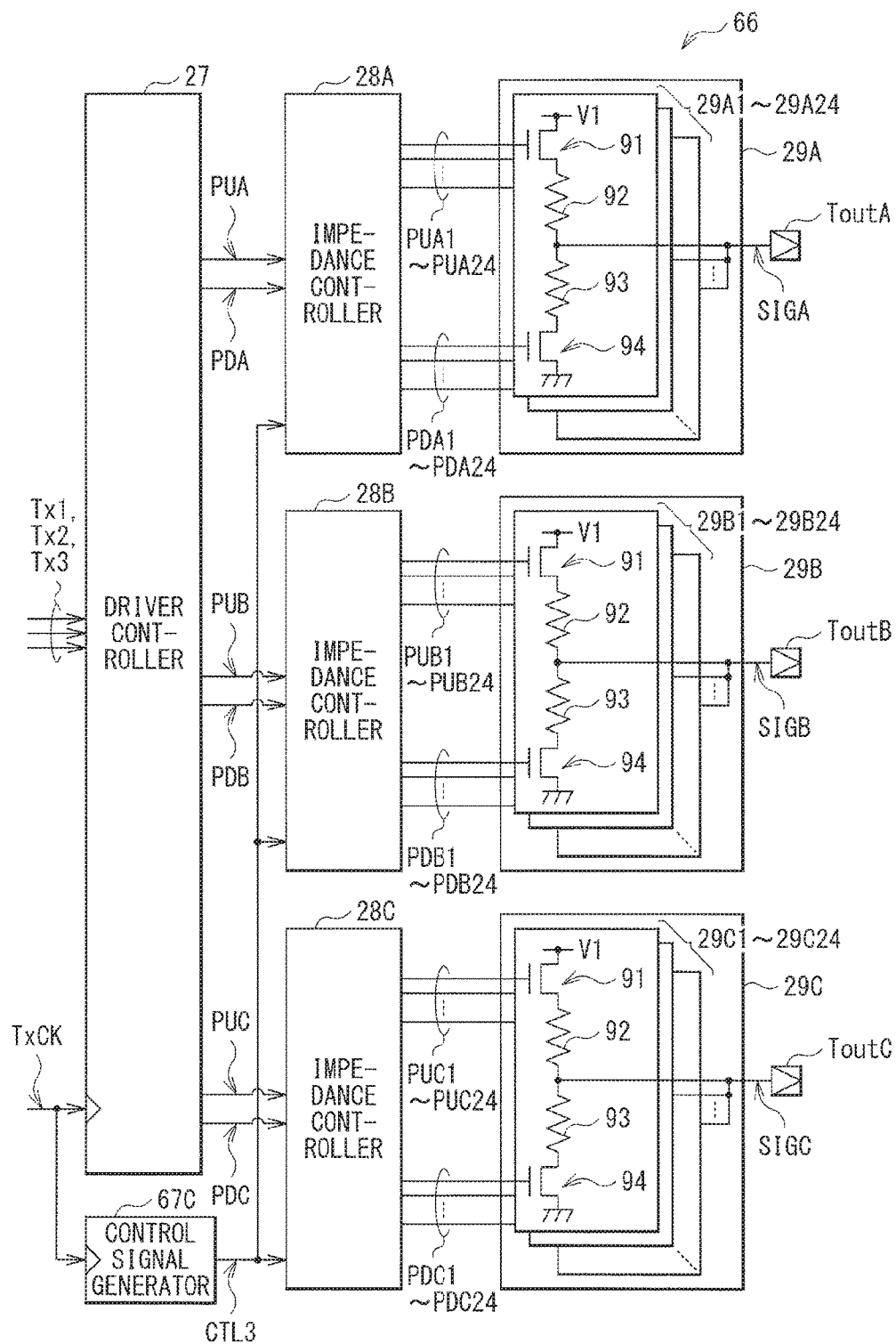

[ FIG. 16 ]
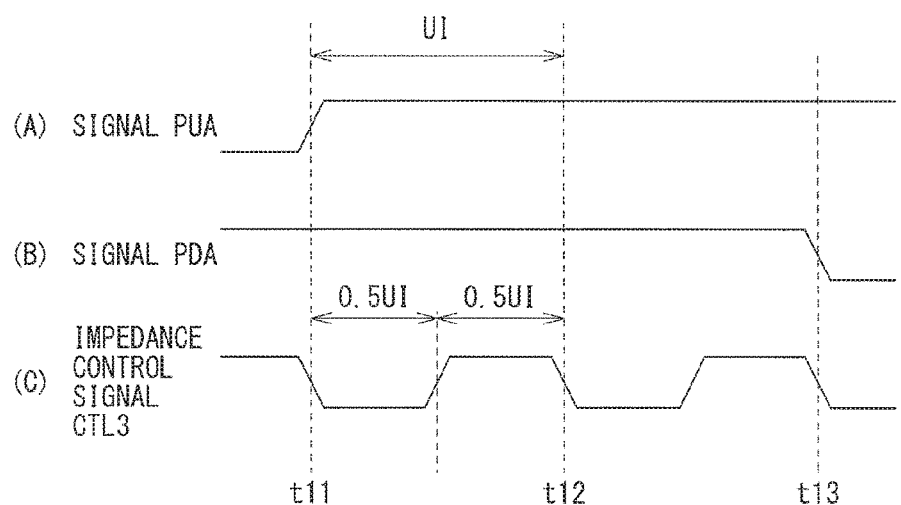

[ FIG. 17A ]
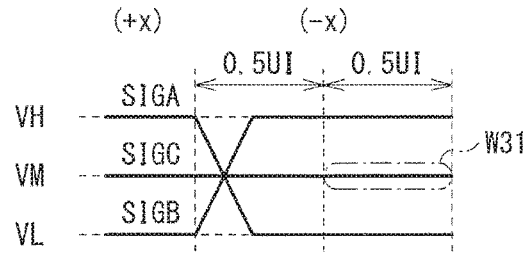
[ FIG. 17B ]
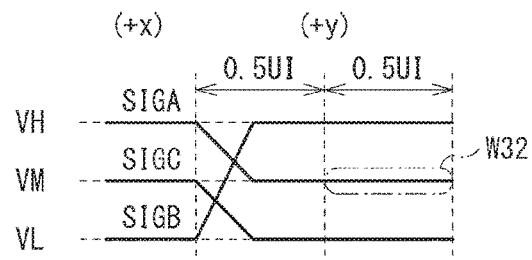
[ FIG. 17C ]
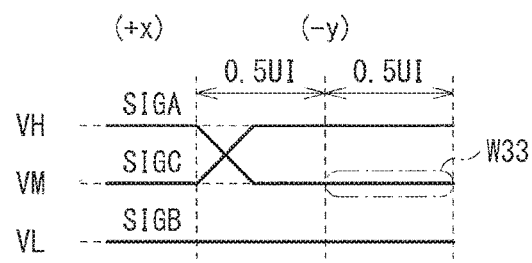
[ FIG. 17D ]
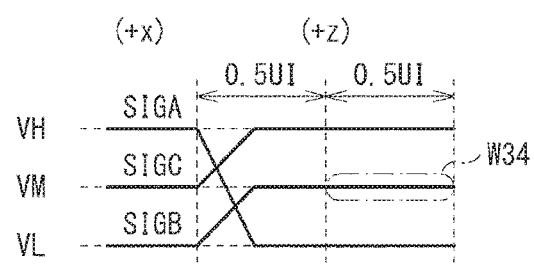
[ FIG. 17E ]
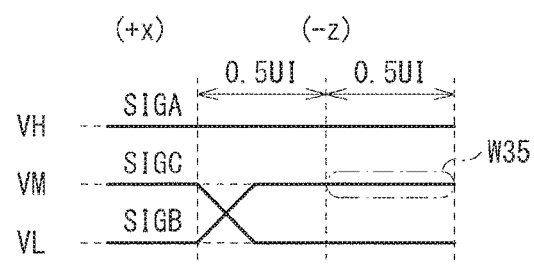

[ FIG. 18 ]
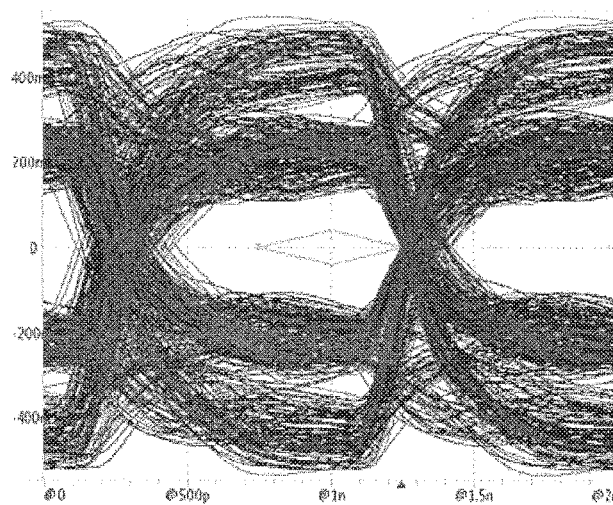
[ FIG. 19 ]
| TxF9, TxR9, TxP9 | DS=+x | DS=-x | DS=+y | DS=-y | DS=+z | DS=-z |
|---|---|---|---|---|---|---|
| 000 | +z | -z | +x | -x | +y | -y |
| 001 | -z | +z | -x | +x | -y | +y | — W4
| 010 | +y | -y | +z | -z | +x | -x |
| 011 | -y | +y | -z | +z | -x | +x | — W4
| 1xx | -x | +x | -y | +y | -z | +z |

[ FIG. 20 ]
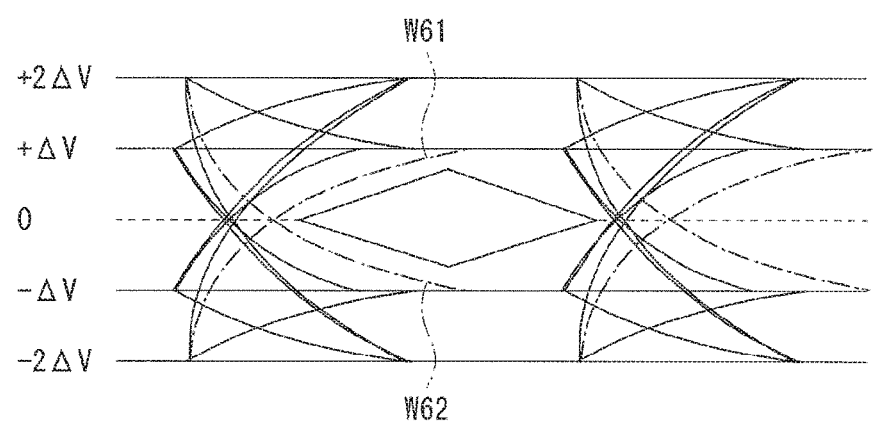

[FIG. 21A]
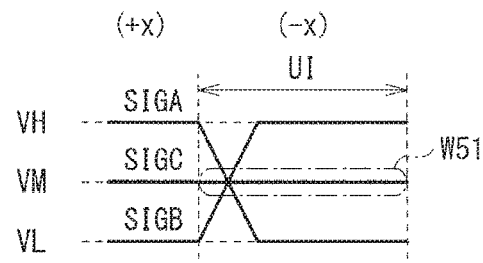
[FIG. 21B]
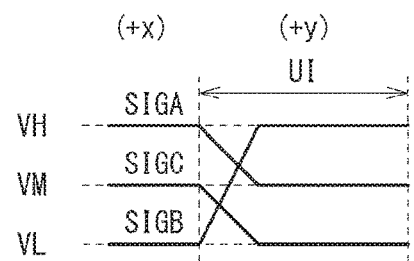
[FIG. 21C]
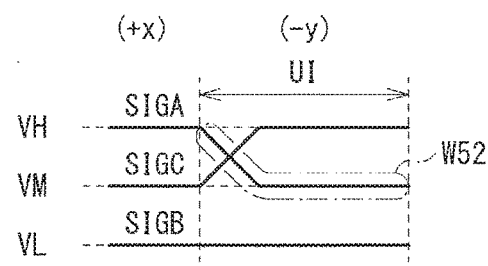
[FIG. 21D]
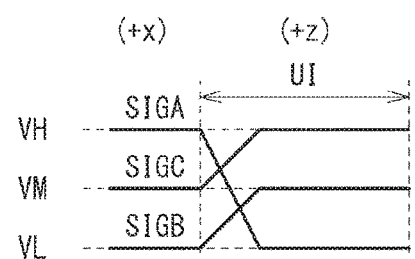
[FIG. 21E]
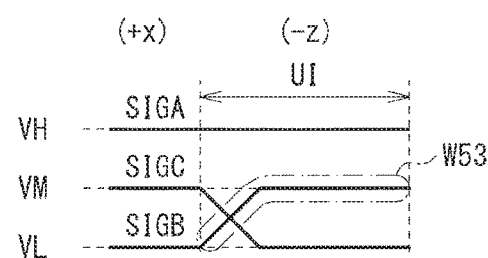

[ FIG. 22 ]
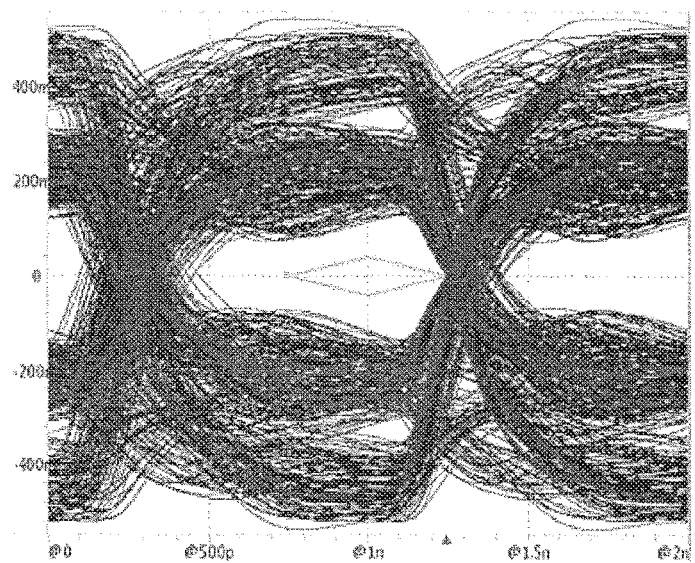
[ FIG. 23 ]
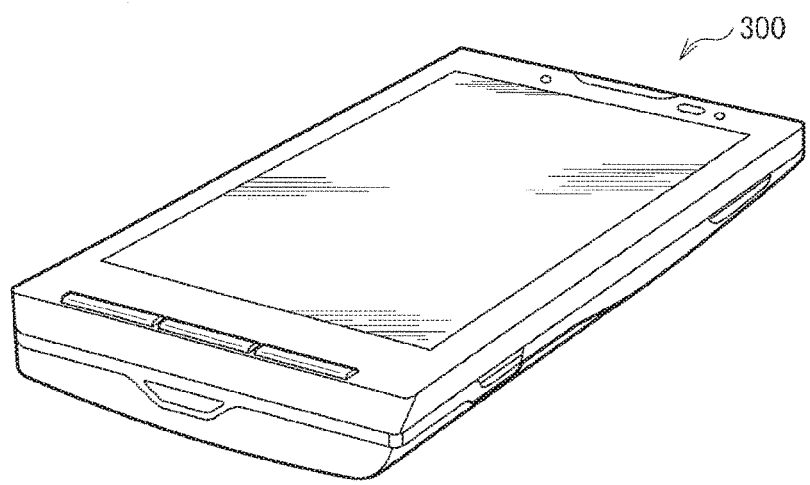

[FIG. 24]
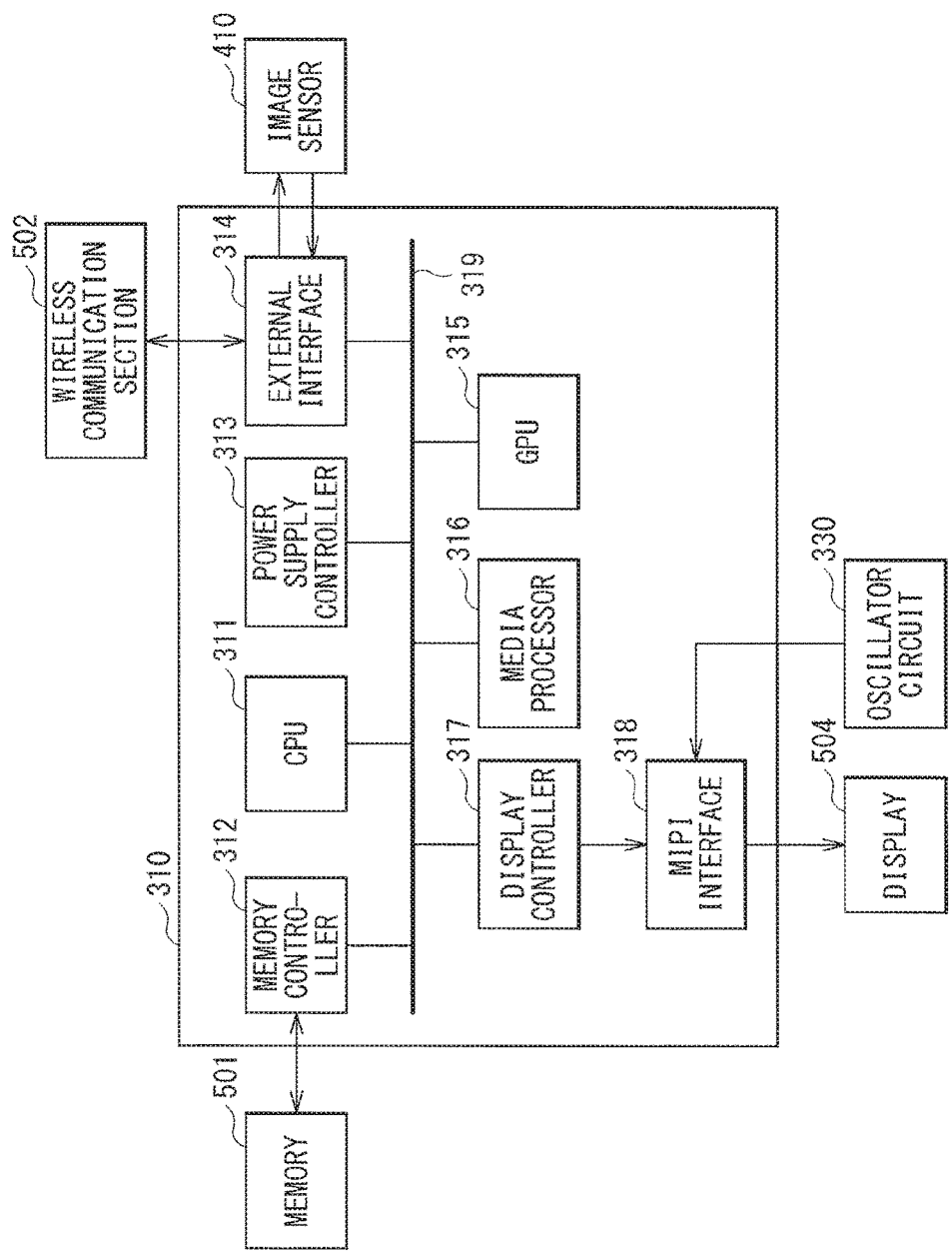

[ FIG. 25 ]
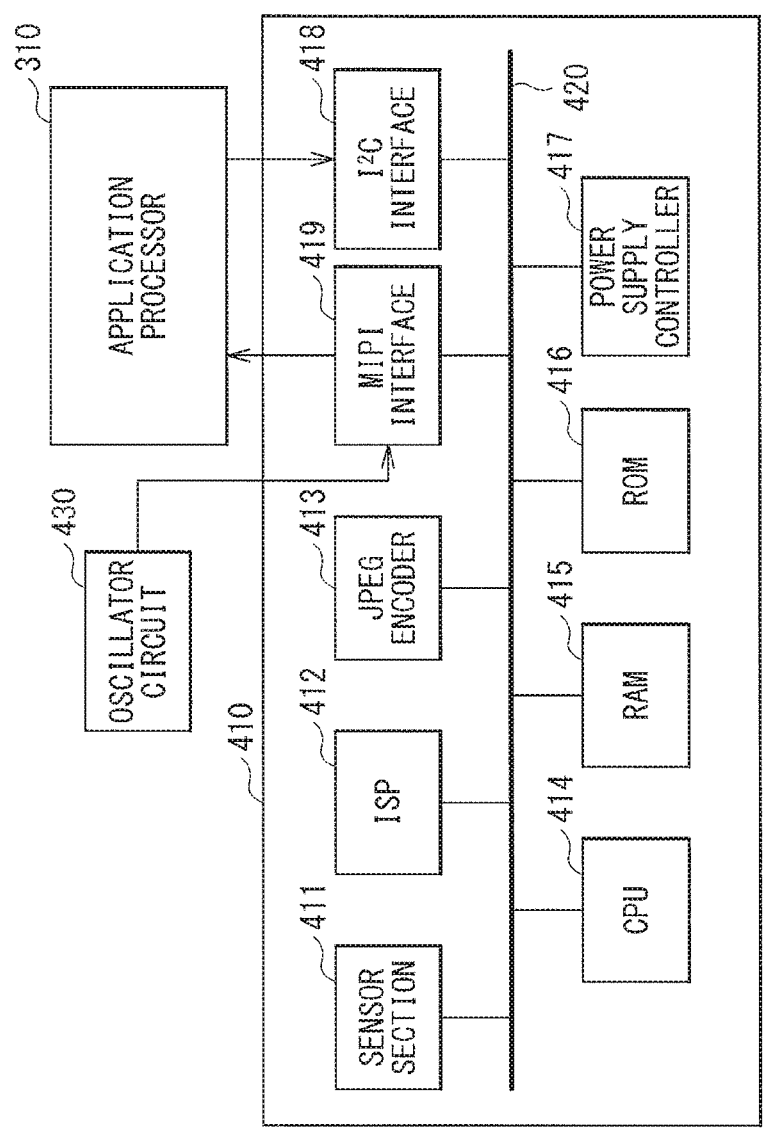

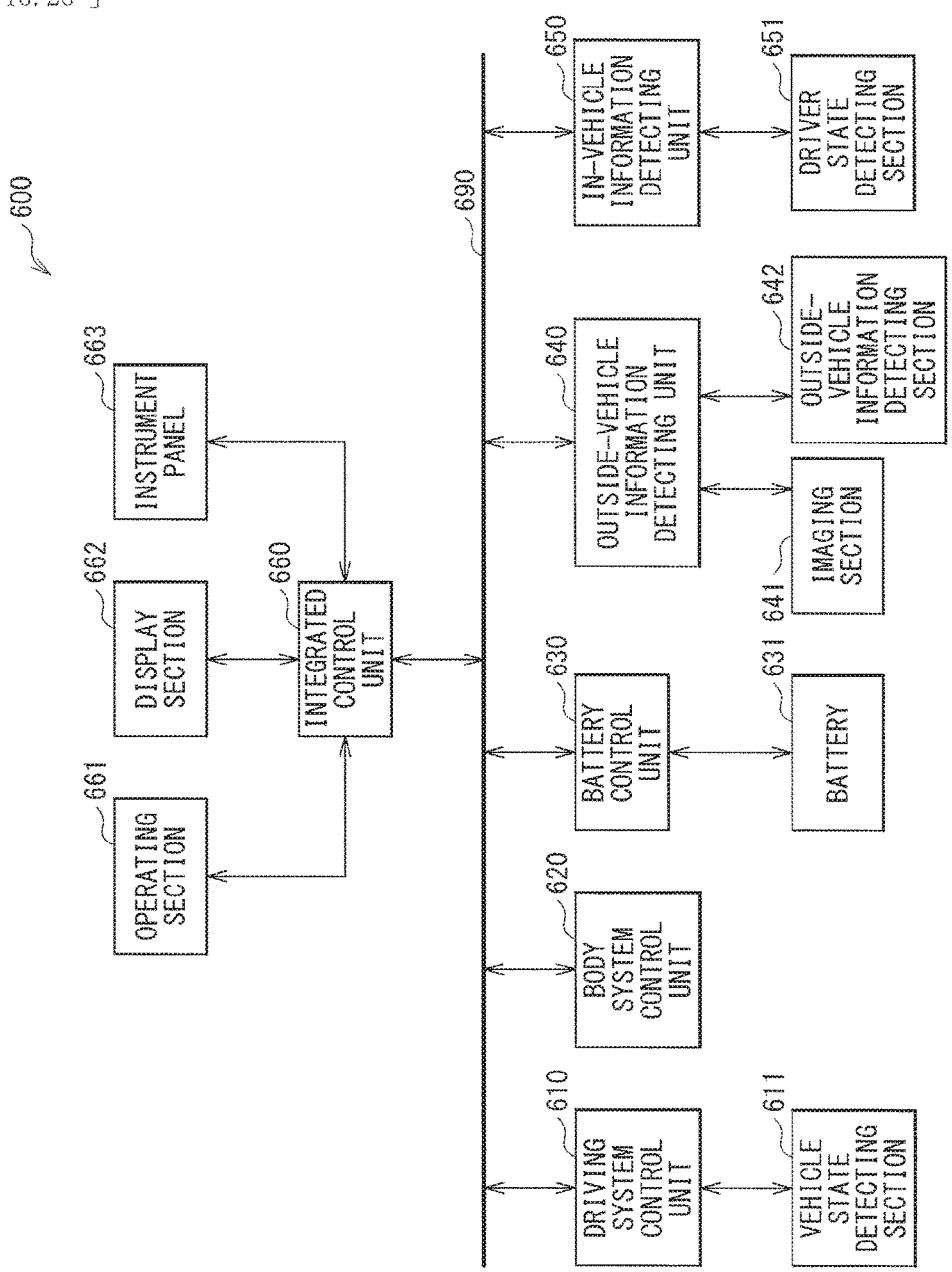
[FIG. 26]

TRANSMISSION DEVICE, TRANSMISSION METHOD, AND COMMUNICATION SYSTEM

TECHNICAL FIELD

The disclosure relates to a transmission device that transmits a signal, a transmission method used in such a transmission device, and a communication system including such a transmission device.

BACKGROUND ART

In association with high functionality and multi-functionality of electronic apparatuses in recent years, the electronic apparatuses are mounted with various devices such as a semiconductor chip, a sensor, and a display device. A lot of pieces of data are exchanged between these devices, and the amount of such data has been increased with high functionality and multi-functionality of the electronic apparatuses. Accordingly, the data are often exchanged with use of a high-speed interface. The high-speed interface is able to transmit and receive data at several Gbps, for example.

There have been disclosed various techniques for a method of further increasing transmission capacity. For example, PTL 1 and PTL 2 each disclose a communication system that transmits three differential signals using three transmission paths.

CITATION LIST

Patent Literature

PTL1: Japanese Unexamined Patent Application Publication No, H06-261092
PTL2: U.S. Pat. No. 8,064,535

SUMMARY OF THE INVENTION

Meanwhile, for electronic apparatuses, reduction in power consumption is generally desired, and reduction in power consumption in the communication system is also expected.

It is desirable to provide a transmission device, a transmission method; and a communication system that make it possible to reduce power consumption.

A transmission device according to an embodiment of the disclosure includes a first driver section and a setting section. The first driver section selectively sets a voltage at a first output terminal to one of a first voltage, a second voltage, and a third voltage that is between the first voltage and the second voltage. The setting section dynamically sets an output impedance of the first driver section at a time when the first driver section sets the voltage at the first output terminal to the third voltage. As used herein, a "voltage at a first output terminal" refers to a voltage at a first output terminal in a case where a communication partner of the transmission device is coupled to the first output terminal.

A transmission method according to an embodiment of the disclosure includes: causing a first driver section to selectively set a voltage at a first output terminal to one of a first voltage, a second voltage, and a third voltage that is between the first voltage and the second voltage; and dynamically setting an output impedance of the first driver section at a time when the first driver section sets the voltage at the first output terminal to the third voltage.

A communication system according to an embodiment of the disclosure includes a transmission device and a reception device. The transmission device includes a first driver section and a setting section. The first driver section selectively sets a voltage at a first output terminal to one of a first voltage, a second voltage, and a third voltage that is between the first voltage and the second voltage. The setting section dynamically sets an output impedance of the first driver section at a time when the first driver section sets the voltage at the first output terminal to the third voltage.

In the transmission device, the transmission method, and the communication system according to the embodiments of the disclosure, a voltage at the first output terminal is selectively set by the first driver to one of the first voltage, the second voltage, and the third voltage. At the time, an output impedance of the first driver section at a time when the first driver section sets the voltage at the first output terminal to the third voltage, is dynamically set.

In the transmission device, the transmission method, and the communication system according to the embodiments of the disclosure, an output impedance of the first driver section at a time when the first driver section sets a voltage at the first output terminal to the third voltage, is dynamically set. This makes it possible to reduce power consumption. It is to be noted that the effects described here are not necessarily limitative, and may have any of the effects described in the disclosure.

BRIEF DESCRIPTION OF DRAWINGS

FIG. 1 is a block diagram illustrating a configuration example of a communication system according to an embodiment of the disclosure.

FIG. 2 describes a voltage state of a signal transmitted and received by the communication system illustrated in FIG. 1.

FIG. 3 describes a transition of a symbol transmitted and received by the communication system illustrated in FIG. 1.

FIG. 4 is a block diagram illustrating a configuration example of a transmitter illustrated in FIG. 1.

FIG. 5 is a table illustrating an example of an operation of a transition detector according to a first embodiment.

FIG. 6 is a table illustrating an example of an operation of an output section illustrated in FIG. 4.

FIG. 7 is a block diagram illustrating a configuration example of the output section illustrated in FIG. 4.

FIG. 8 is a timing waveform chart illustrating an example of an operation of a timing controller illustrated in FIG. 7.

FIG. 9 is a block diagram illustrating a configuration example of a receiver illustrated in FIG. 1.

FIG. 10 describes an example of a receiving operation of the receiver illustrated in FIG. 9.

FIG. 11A is a timing waveform chart illustrating an example of an operation of a communication system according to the first embodiment.

FIG. 11B is a timing waveform chart illustrating an example of an operation of the communication system according to the first embodiment.

FIG. 11C is a timing waveform chart illustrating an example of an operation of the communication system according to the first embodiment.

FIG. 11D is a timing waveform chart illustrating an example of an operation of the communication system according to the first embodiment.

FIG. 11E is a timing waveform chart illustrating an example of an operation of the communication system according to the first embodiment.

FIG. 12 is a circuit diagram illustrating an example of an operation of the communication system according to the first embodiment.

FIG. 13A is an eye diagram illustrating an example of a characteristic of the communication system according to the first embodiment.

FIG. 13B is an eye diagram illustrating an example of a characteristic of a communication system according to a comparative example.

FIG. 14 is a block diagram illustrating a configuration example of a transmitter according to a second embodiment.

FIG. 15 is a table illustrating an example of art operation of an output section illustrated in FIG. 14.

FIG. 16 is a timing waveform chart illustrating an example of an operation of a control signal generator illustrated in FIG. 15.

FIG. 17A is a timing waveform chart illustrating an example of an operation of a communication system according to the second embodiment.

FIG. 17B is a timing waveform chart illustrating an example of an operation of the communication system according to the second embodiment.

FIG. 17C is a timing waveform chart illustrating an example of an operation of the communication system according to the second embodiment.

FIG. 17D is a timing waveform chart illustrating an example of an operation of the communication system according to the second embodiment.

FIG. 17E is a timing waveform chart illustrating an example of an operation of the communication system according to the second embodiment.

FIG. 18 is an eye diagram illustrating an example of a characteristic of the communication system according to the second embodiment.

FIG. 19 is a table illustrating an example of an operation of a transition detector according to a third embodiment.

FIG. 20 is an eye diagram schematically illustrating an example of a characteristic of a communication system.

FIG. 21A is a timing waveform chart illustrating an example of an operation of a communication system according to the third embodiment.

FIG. 21B is a timing waveform chart illustrating an example of an operation of the communication system according to the third embodiment.

FIG. 21C is a timing waveform chart illustrating an example of an operation of the communication system according to the third embodiment.

FIG. 21D is a timing waveform chart illustrating an example of an operation of the communication system according to the third embodiment.

FIG. 21E is a timing waveform chart illustrating an example of an operation of the communication system according to the third embodiment.

FIG. 22 is an eye diagram illustrating an example of a characteristic of the communication system according to the third embodiment.

FIG. 23 is a perspective view illustrating an appearance configuration of a smartphone to which a communication system according to an embodiment is applied.

FIG. 24 is a block diagram illustrating a configuration example of an application processor to which a communication system according to an embodiment is applied.

FIG. 25 is a block diagram illustrating a configuration example of an image sensor to which a communication system according to an embodiment is applied.

FIG. 26 is a block diagram illustrating a configuration example of a vehicle control system to which a communication system according to an embodiment is applied.

MODES FOR CARRYING OUT THE INVENTION

In the following, some embodiments of the disclosure are described in detail with reference to the drawings. It is to be noted that descriptions are given in the following order:
1. First Embodiment
2. Second Embodiment
3. Third Embodiment
4. Application Example

1. FIRST EMBODIMENT

Configuration Example

FIG. 1 illustrates a configuration example of a communication system according to a first embodiment. A communication system 1 performs communication, using a signal having three voltage levels.

The communication system 1 includes a transmission device 10, a transmission path 100, and a reception device 30. The transmission device 10 includes three output terminals ToutA, ToutB, and ToutC. The transmission path 100 includes lines 110A, 110B, and 110C. The reception device 30 includes three input terminals TinA, TinB, and TinC. Then, the output terminal ToutA of the transmission device 10 and the input terminal TinA of the reception device 30 are coupled to each other via the line 110A, the output terminal ToutB of the transmission device 10 and the input terminal TinB of the reception device 30 are coupled to each other via the line 110B, and the output terminal ToutC of the transmission device 10 and the input terminal TinC of the reception device 30 are coupled to each other via the line 110C. In this example, each of the lines 110A to 110C has a characteristic impedance of about 50 [Ω].

The transmission device 10 outputs a signal SIGA from the output terminal ToutA, outputs a signal SIGB from the output terminal ToutB, and outputs a signal SIGC from the output terminal ToutC. Then, the reception device 30 receives the signal SIGA via the input terminal TinA, receives the signal SIGB via the input terminal TinB, and receives the signal SIGC via the input terminal TinC. As described later, the communication system 1 omits a terminating resistor from the reception device 30, thus making it possible to reduce power consumption. Each of the signals SIGA, SIGB, and SIGC transitions among the three voltage levels (high-level voltage VH, medium-level voltage VM, and low-level voltage VL).

FIG. 2 illustrates a voltage state of each of the signals SEGA, SIGB, and SIGC. The transmission device 10 transmits six symbols "+x", "−x", "+y", "−y", "+z", and "−z", using the three signals SIGA, SIGB, and SIGC. For example, in a case of transmitting the symbol "+x", the transmission device 10 sets the signal SIGA to the high-level voltage VH, sets the signal SIGB to the low-level voltage VL, and sets the signal SIGC to the medium-level voltage VM. In a case of transmitting the symbol "−x", the transmission device 10 sets the signal SIGA to the low-level voltage VL, sets the signal SIGB to the high-level voltage VH, and sets the signal SIGC to the medium-level voltage VM. In a case of transmitting the symbol "+y", the transmission device 10 sets the signal SIGA to the medium-level voltage VM, sets the signal SIGB to the high-level voltage VH, and sets the signal SIGC to the low-level voltage VL. In a case of transmitting the symbol "−y", the transmission device 10 sets the signal SIGA to the medium-level voltage VM, sets the signal SIGB to the low-level voltage VL, and sets the signal SIGC to the high-level voltage VH. In a case of transmitting the symbol "+z", the transmission device 10 sets the signal SIGA to the low-level voltage VL, sets the signal SIGB to the medium-level voltage VM, and sets the signal SIGC to the high-level voltage VH. In a case of transmitting the symbol "−z", the transmission device 10 sets the signal SIGA to the high-level voltage VH, sets the signal SIGB to the medium-level voltage VM, and sets the signal SIGC to low-level voltage VL.

The transmission path 100 transmits a sequence of a symbol, using such signals SIGA, SIGB, and SIGC. In other words, the three lines 110A, 110B, and 110O function as one lane through which the sequence of the symbol is transmitted.

[Transmission Device 10]

As illustrated in FIG. 1, the transmission device 10 includes a clock generator 11, a processor 12, and a transmitter 20.

The clock generator 11 generates a clock signal TxCK. The clock signal TxCK has a frequency of 1 [GHz], for example. It is to be noted that the clock signal TxCK, not limited thereto, may also have a frequency of 0.5 [GHz], for example, in a case of using what is called a half rate architecture to configure a circuit in the transmission device 10. The clock generator 11 includes, for example, a phase-locked loop (PLL), and generates the clock signal TxCK on the basis of a reference clock (not illustrated) to be supplied from the outside of the transmission device 10. Then, the clock generator 11 supplies this clock signal TxCK to the processor 12 and the transmitter 20.

The processor 12 generates transition signals TxF0 to TxF6, TxR0 to TxR6, and TxP0 to TxP6 by performing predetermined processing. Here, a set of transition signals TxF0, TxR0, and TxP0 indicates a transition of a symbol in a sequence of the symbol to be transmitted by the transmission device 10. Likewise, a set of transition signals TxF1, TxR1, and TxP1 indicates a transition of the symbol, a set of transition signals TxF2, TxR2, and TxP2 indicates a transition of the symbol, a set of transition signals TxF3, TxR3, and TxP3 indicates a transition of the symbol, a set of transition signals TxF4, TxR4, and TxP4 indicates a transition of the symbol, a set of transition signals TxF5, TxR5, and TxP5 indicates a transition of the symbol, and a set of transition signals TxF6, TxR6, and TxP6 indicates a transition of the symbol. In other words, the processor 12 generates seven sets of transition signals. In the following, transition signals TxF, TxR, and TxP are used as appropriate to represent any set among the seven sets of transition signals.

FIG. 3 illustrates a relationship between the transition signals TxF, TxR, and TxP and the transition of the symbol. A three-digit numerical value assigned to each transition indicates values of the transition signals TxF, TxR, and TxP in this order.

The transition signal TxF (Flip) causes the symbol to transition between "+x" and "−x", causes the symbol to transition between "+y" and "−y", and causes the symbol to transition between "+z" and "−z". Specifically, in a case where the transition signal TxF is "1", the symbol is caused to transition to change a polarity thereof (for example, from "+x" to "−x"), and in a case where the transition signal TxF is "0", such a transition is not performed.

In a case where the transition signal TxF is "0", the transition signals TxR (Rotation) and TxP (Polarity) cause the symbol to transition between "+x" and those other than "−x", between "+y" and those other than "−y", and between "+z" and those other than "−z". Specifically, in a case where the transition signals TxR and TxP are "1" and "0", the symbol, while keeping the polarity, is caused to transition clockwise (for example, from "+x" to "+y") in FIG. 3. In a case where the transition signals TxR and TxP are "1" and "1", the symbol is caused to change the polarity and also transition clockwise (for example, from "+x" to "−y") in FIG. 3. In addition, in a case where the transition signals TxR and TxP are "0" and "0", the symbol, while keeping the polarity, is caused to transition counterclockwise (for example, from "+x" to "+z" FIG. 3. In a case where the transition signals TxR and TxP are "0" and "1", the symbol is caused to change the polarity and also transition counterclockwise (for example, from "+x" to "−z") in FIG. 3.

The processor 12 generates seven sets of such transition signals TxF, TxR, and TxP. Then, the processor 12 supplies these seven sets of transition signals TxF. TxR, and TxP (transition signals TxF0 to TxF6, TxR0 to TxR6, and TxP0 to TxP6) to the transmitter 20.

The transmitter 20 generates the signals SIGA, SIGB, and SIGC on the basis of the transition signals TxF0 to TxF6, TxR0 to TxR6, and TxP0 to TxP6.

FIG. 4 illustrates a configuration example of the transmitter 20. The transmitter 20 includes serializers 21F, 21R, and 21P, a transmission symbol generator 22, a transition detector 25, and an output section 26.

The serializer 21F generates a transition signal TxF9 by serializing the transition signals TxF0 to TxF6 in this order on the basis of the transition signals TxF0 to TxF6 and the clock signal TxCK. The serializer 21R generates a transition signal TxR9 by serializing the transition signals TxR0 to TxR6 in this order on the basis of the transition signals TxR0 to TxR6 and the clock signal TxCK. The serializer 21P generates a transition signal TxP9 by serializing the transition signals TxP0 to TxP6 in this order on the basis of the transition signals TxP0 to TxP6 and the clock signal TxCK.

The transmission symbol generator 22 generates symbol signals Tx1, Tx2, and Tx3 on the basis of the transition signals TxF9, TxR9, and TxP9 and the clock signal TxCK. The transmission symbol generator 22 includes a signal generator 23 and a flip-flop 24.

The signal generator 23 generates the symbol signals Tx1, Tx2, and Tx3 on the basis of the transition signals TxF9, TxR9, and TxP9 and symbol signals D1, D2, and D3. Specifically, the signal generator 23, on the basis of the symbol indicated by the symbol signals D1, D2, and D3 (a symbol DS before transition) and the transition signals TxF9, TxR9, and TxP9, determines a symbol NS after transition as illustrated in FIG. 3 and outputs the symbol NS as the symbol signals Tx1, Tx2, and Tx3.

The flip-flop 24 performs sampling of the symbol signals Tx1, Tx2, and Tx3 on the basis of the clock signal TxCK, and outputs results of the sampling, respectively, as the symbol signals D1, D2, and D3.

FIG. 5 illustrates an example of an operation of the transmission symbol generator 22. This FIG. 5 illustrates the symbol NS to be generated on the basis of the symbol DS indicated by the symbol signals D1, D2, and D3 and the transition signals TxF9, TxR9, and TxP9. A case where the symbol DS is "+x" is described as an example. In a case where the transition signals TxF9, TxR9, and TxP9 are "000", the symbol NS is "+z". In a case where the transition signals TxF9. TxR9, and TxP9 are "001", the symbol NS is "−z". In a case where the transition signals TxF9, TxR9, and TxP9 are "010", the symbol NS is "+y". In a case where the transition signals TxF9, TxR9, and TxP9 are "011", the symbol NS is "−y". In a case where the transition signals TxF9, TxR9, and TxP9 are "1xx", the symbol NS is "−x".

Here, "x" indicates that any one of "1" and "0" may be adopted. The same applies to a case where the symbol DS is any of "−x", "+y", "−y", "+z", and "−z".

The transition detector 25 generates an impedance control signal CTL on the basis of the transition signals TxF9, TxR9, and TxP9. Specifically, as indicated by W1 in FIG. 5, the transition detector 25 sets the impedance control signal CTL to "1" (active) in a case where the transition signals TxF9, TxR9, and TxP9 are "1xx", and sets the impedance control signal CTL to "0" (inactive) in other cases. In other words, the transition detector 25 first confirms, on the basis of whether or not the transition signals TxF9, TxR9, and TxP9 are "1xx", whether or not one of the signals SIGA, SIGB, and SIGC maintains the medium-level voltage VM when the symbol transitions. Specifically, first, in a case where the transition signals TxF9, TxR9, and TxP9 are "1xx", the symbol transitions, as illustrated in FIG. 5, between "+x" and "−x", between "+y" and "−y", or between "+z" and "−z". For example, in a case where the symbol transitions between "+x" and "−x", as illustrated in FIG. 2, the signal SIGC maintains the medium-level voltage VM. In addition, for example, in a case where the symbol transitions between "+y" and "−y", the signal SIGA maintains the medium-level voltage VM. In addition, for example, in a case where the symbol transitions between "+z" and "−z", the signal SIGB maintains the medium-level voltage VM. In this manner, the transition detector 25 confirms, on the basis of whether or not the transition signals TxF9, TxR9, and TxP9 are "1xx", whether or not one of the signals SIGA, SIGB, and SIGC maintains the medium-level voltage VM when the symbol transitions. Then, the transition detector 25 sets the impedance control signal CTL to "1" (active) in a case where one of the signals SIGA, SIGB, and SIGC maintains the medium-level voltage VM.

The output section 26 generates the signals SIGA, SIGB, and SIGC on the basis of the symbol signals Tx1, Tx2, and Tx3 and the clock signal TxCK.

FIG. 6 illustrates an example of an operation of the output section 26. For example, in a case where the symbol signals Tx1, Tx2, and Tx3 are "100", the output section 26 sets the signal SIGA to the high-level voltage VH, sets the signal SIGB to the low-level voltage VL, and sets the signal SIGC to the medium-level voltage VM. In other words, the output section 26 generates the symbol "+x". In addition, for example, in a case where the symbol signals Tx1, Tx2, and Tx3 are "011", the output section 26 sets the signal SIGA to the low-level voltage VL, sets the signal SIGB to the high-level voltage VH, and sets the signal SIGC to the medium-level voltage VM. In other words, the output section 26 generates the symbol "−x". In addition, for example, in a case where the symbol signals Tx1, Tx2, and Tx3 are "010", the output section 26 sets the signal SIGA to the medium-level voltage VM, sets the signal SIGB to the high-level voltage VH, and sets the signal SIGC to the low-level voltage VL. In other words, the output section 26 generates the symbol "+y". In addition, for example, in a case where the symbol signals Tx1, Tx2, and Tx3 are "101", the output section 26 sets the signal SIGA to the medium-level voltage VM, sets the signal SIGB to the low-level voltage VL, and sets the signal SIGC to the high-level voltage VH. In other words, the output section 26 generates the symbol "−y". In addition, for example, in a case where the symbol signals Tx1, Tx2, and Tx3 are "001", the output section 26 sets the signal SIGA to the low-level voltage VL, sets the signal SIGB to the medium-level voltage VM, and sets the signal SIGC to the high-level voltage NTH. In other words, the output section 26 generates the symbol "+z". In addition, for example, in a case where the symbol signals Tx1, Tx2, and Tx3 are "110", the output section 26 sets the signal SIGA to the high-level voltage VH, sets the signal SIGB to the medium-level voltage VM, and sets the signal SIGC to the low-level voltage VL. In other words, the output section 26 generates the symbol "−z".

FIG. 7 illustrates a configuration example of the output section 26. The output section 26 includes a driver controller 27, a timing controller 27T, impedance controllers 28A, 28B, and 28C, and driver sections 29A, 29B, and 29C.

The driver controller 27 generates signals PUA, PDA, PUB, PDB, PUC, and PDC on the basis of the symbol signals Tx1, Tx2, and Tx3 and the clock signal TxCK. Specifically, as illustrated in FIG. 6, for example, in a case of setting the signal SIGA to the high-level voltage VH, the driver controller 27 sets the signal PUA to "1" and also sets the signal PDA to "0". In a case of setting the signal SIGA to the low-level voltage VL, the driver controller 27 sets the signal PDA to "1" and also sets the signal PUA to "0". In a case of setting the signal SIGA to the medium-level voltage VM the driver controller 27 sets both of the signals PUA and PDA to "1". The same applies to the signals PUB and PDB and the signals PUC and PDC. Then, the driver controller 27 supplies the signals PUA and PDA to the impedance controller 28A, supplies the signals PUB and PDB to the impedance controller 28B, and supplies the signals PVC and PDC to the impedance controller 28C.

The timing controller 27T generates an impedance control signal CTL2 by performing timing adjustment of the impedance control signal CTL on the basis of the impedance control signal CTL and the clock signal TxCK. Then, the timing controller 27T supplies this impedance control signal CTL2 to each of the impedance controllers 28A to 28C.

FIG. 8 illustrates an example of a waveform of each of the signals PUA and PDA and the impedance control signal CTL2 to be supplied to the impedance controller 28A. Each of the signals PUA and PDA may change depending on a period (unit interval UI) corresponding to one symbol. In this example, at timing t1, the signal PUA changes from low level to high level ((A) of FIG. 8), and the signal PDA changes from high level to low level at timing t3 at which time equivalent to two unit intervals UI has elapsed from the timing t1 ((B) of FIG. 8). Then, the impedance control signal CTL2 may change at a starting timing of the unit interval UI. In this example, the impedance control signal CTL2 changes from low level to high level at timing t2 at which time equivalent to one unit interval UI has elapsed from the timing t1, and changes from high level to low level at the timing 3 ((C) of FIG. 8). In this example, although the signals to be supplied to the impedance controller 28A have been described, the same applies to the signals to be supplied to each of the impedance controllers 28B and 28C. In this manner, the timing controller 27T performs timing adjustment of the impedance control signal CTL, to cause the impedance control signal CTL2 to change at the starting timing of the unit interval UI.

The impedance controller 28A generates signals PUA1 to PUA24 and PDA1 to PDA24 on the basis of the signals PUA and PDA and the impedance control signal CTL2. The driver section 29A generates the signal SIGH on the basis of the signals PUA1 to PUA24 and PDA1 to PDA24. In this example, the driver section 29A includes twenty-four drivers 29A1 to 29A24. The driver 29A1 operates on the basis of PUA1 and PDA1, and the driver 29A2 operates on the basis of PUA2 and PDA2. The same applies to the drivers 29A3 to 29A23. The driver 29A24 operates on the basis of PUA24 and PDA24. The drivers 29A1 to 29A24 have output terminals that are coupled to one another and are also coupled to the output terminal ToutA. It is to be noted that, although twenty-four drivers 29A1 to 29A24 are provided in this example, this is not limitative; alternatively, not more than 19 or not less than 21 drivers may be provided.

The impedance controller 28B, as with the impedance controller 28A, generates signals PUB1 to PUB24 and PDB1 to PDB24 on the basis of the signals PUB and PDB and the impedance control signal CTL2. The driver section 29B, as with the driver section 29A, generates the signal SIGB on the basis of the signals PUB1 to PUB24 and PDB1 to PDB24. In this example, the driver section 29B includes twenty-four drivers 29B1 to 29B24. The drivers 29B1 to 29B24 have output terminals that are coupled to one another and are also coupled to the output terminal ToutB.

The impedance controller 28C, as with the impedance controller 28A, generates signals PUC1 to PUC24 and PDC1 to PDC24 on the basis of the signals PVC and PDC and the impedance control signal CTL2. The driver section 29C, as with the driver section 29A, generates the signal SIGC on the basis of the signals PUC1 to PUC24 and PDC1 to PDC24. In this example, the driver section 29C includes twenty-four drivers 2901 to 29C24. The drivers 29C1 to 29C24 have output terminals that are coupled to one another and are also coupled to the output terminal ToutC.

Next, a configuration of each of the drivers 29A1 to 29A24, 29B1 to 29B74, and 29C1 to 29C24 is described, referring to the driver 29A1 as an example. The driver 29A1 includes transistors 91 and 94, and resistors 92 and 93. In this example, the transistors 91 and 94 are each an N-channel Metal Oxide Semiconductor (MOS) Field Effect Transistor (FET). The transistor 91 has a gate supplied with the signal PUA1, a drain supplied with voltage V1, and a source coupled to a first end of the resistor 92. The transistor 94 has a gate supplied with the signal PDA1, a drain coupled to a first end of the resistor 93, and a source grounded. The resistor 92 has the first end coupled to the source of the transistor 91, while having a second end coupled to a second end of the resistor 93 and to the output terminal ToutA of the transmission device 10. The resistor 93 has the first end coupled to the drain of the transistor 94, while having the second end coupled to the second end of the resistor 92 and to the output terminal ToutA of the transmission device 10. In this example, a sum of an on-resistance of the transistor 91 and a resistance value of the resistor 92 is about 1000 [Ω]. Likewise, a sum of an on-resistance of the transistor 94 and a resistance value of the resistor 93 is about 1000 [Ω].

According to this configuration, the driver controller 27, for example, sets a voltage at the output terminal ToutA to one of three voltages (the high-level voltage VH, the low-level voltage VL, and the medium-level voltage VM), using the signals PUA and PDA. Specifically, for example, in a case of setting the voltage at the output terminal ToutA to the high-level voltage VH, the driver controller 27 sets the signal PUA to "1" and also sets the signal PDA to "0". This causes the impedance controller 284 to set twenty signals out of the signals PUA1 to PUA24 to "1" and set remaining four signals out of the signals PUA1 to PUA24, and the signals PDA1 to PDA24 to "0". At this time, in the driver section 29A, twenty out of the twenty-four transistors 91 are turned on. As a result, the signal SIGA becomes the high-level voltage VH, and an output terminating resistor (output impedance) of the driver section 29A also becomes about 50 [Ω](=1000/20). In addition, in a case of setting the voltage at the output terminal ToutA to the low-level voltage VL, the driver controller 27 sets the signal PDA to "1" and also sets the signal PUA to "0". This causes the impedance controller 28A to set twenty signals out of the signals PDA1 to PDA24 to "1" and set remaining four signals out of the signals PDA1 to PDA20 and the signals PUA1 to PUA24 to "0". At this time, in the driver section 29A, twenty out of the twenty-four transistors 94 are turned on. As a result, the signal SIGA becomes the low-level voltage VL, and the output terminating resistor (output impedance) of the driver section 29A also becomes about 50 [Ω].

In addition, in a case of setting the voltage at the output terminal ToutA to the medium-level voltage VM, the driver controller 27 sets both of the signals PUA and PDA to "1". At this time, in a case where the impedance control signal CTL2 is "0", the impedance controller 28A sets ten signals out of the signals PUA1 to PUA24 and ten signals out of the signals PDA1 to PDA24 to "I", and sets remaining fourteen signals out of the signals PUA1 to PUA24 and remaining fourteen signals out of the signals PDA1 to PDA24 to "0". At this time, in the driver section 29A, ten out of the twenty-four transistors 91 are turned on, and ten out of the twenty-four transistors 94 are also turned on. As a result, the signal SIGA becomes the medium-level voltage VM, and the output terminating resistor (output impedance) of the driver section 29A also becomes about 50 [Ω]. In addition, in a case where the impedance control signal CTL2 is "1", the impedance controller 28A sets one of the signals PUA1 to PUA24 and one of the signals PDA1 to PDA24 to "1", and sets remaining twenty-three signals out of the signals PUA1 to PUA24 and remaining twenty-three signals out of the signals PDA1 to PDA24 to "0". At this time, in the driver section 29A, one of the twenty-four transistors 91 is turned on, and one of the twenty-four transistors 94 is also turned on. As a result, the signal SIGA becomes the medium-level voltage VM, and the output terminating resistor (output impedance) of the driver section 29A also becomes about 500 [Ω] (=1000/2).

Thus, the driver controller 27 sets the voltage at each of the output terminals ToutA, ToutB, and ToutC, using the signals PUA. PDA, PUB, PDB, PUC, and PDC. In addition, the impedance controller 28A sets the output impedance of the driver section 29A for a case where the driver section 29A outputs the medium-level voltage VM, by changing, on the basis of the signals PUA and PDA and the impedance control signal CTL2, the number of the transistors 91 and 94 to be turned on. Likewise, the impedance controller 28B sets the output impedance of the driver section 29B for a case where the driver section 299 outputs the medium-level voltage VM, by changing, on the basis of the signals PUB and PDB and the impedance control signal CTL2, the number of the transistors 91 and 94 to be turned on. The impedance controller 28C sets the output impedance of the driver section 29C for a case where the driver section 29C outputs the medium-level voltage VM, by changing, on the basis of the signals PUC and PDC and the impedance control signal CTL2, the number of the transistors 91 and 94 to be turned on.

In this situation, as described later, the impedance controller 28A sets a higher output impedance for the driver section 29A in a case where the signal SIGA maintains the medium-level voltage VM when the symbol transitions. Likewise, the impedance controller 28B sets a higher output impedance for the driver section 29B in a case where the signal SIGB maintains the medium-level voltage VM. The impedance controller 28C sets a higher output impedance for the driver section 29C in a case where the signal SIGC maintains the medium-level voltage VM. This allows the communication system 1 to reduce power consumption.

(Reception Device 30)

As illustrated in FIG. 1, the reception device 30 includes a receiver 40 and a processor 32.

The receiver 40 receives the signals SIGA, SIGB, and SIGC, and also generates transition signals RxF, RxR, and RxP and a clock signal RxCK on the basis of these signals SIGA, SIGB, and SIGC.

FIG. 9 illustrates a configuration example of the receiver 40. The receiver 40 includes resistors 41A, 41B, and 41C, switches 42A, 42B, and 42C, amplifiers 43A, 43B, and 43C, a clock generator 44, flip-flops 45 and 46, and a signal generator 47.

The resistor 41A has a first end coupled to the input terminal TinA and also supplied with the signal SIGA, while having a second end coupled to a first end of the switch 42A. The resistor 41B has a first end coupled to the input terminal TinB and also supplied with the signal SIGB, while having a second end coupled to a first end of the switch 42B. The resistor 41C has a first end coupled to the input terminal TinC and also supplied with the signal SIGC, while having a second end coupled to a first end of the switch 42C.

The switch 42A has the first end coupled to the second end of the resistor 41A, while having a second end coupled to a second end of each of the switches 42B and 42C. The switch 42B has the first end coupled to the second end of the resistor 41B, while having the second end coupled to the second end of each of the switches 42A and 42C. The switch 42C has the first end coupled to the second end of the resistor 41C, while having the second end coupled to the second end of each of the switches 424 and 42B. In the reception device 30, the switches 42A, 42B, and 42C are set to be turned off to prevent each of the resistors 41A to 41C from functioning as the terminating resistor. As a result, this allows the communication system 1 to reduce power consumption.

The amplifier 43A has a positive input terminal that is coupled to a negative input terminal of the amplifier 43C and to the first end of the resistor 41A and is also supplied with the signal SIGA, while having a negative input terminal that is coupled to a positive input terminal of the amplifier 43B and to the first end of the resistor 41B and is also supplied with the signal SIGB. The amplifier 43B has the positive input terminal that is coupled to the negative input terminal of the amplifier 43A and to the first end of the resistor 41B and is also supplied with the signal SIGB, while having a negative input terminal that is coupled to a positive input terminal of the amplifier 43C and to the first end of the resistor 41C and is also supplied with the signal SIGC. The amplifier 43C has the positive input terminal that is coupled to the negative input terminal of the amplifier 439 and to the first end of the resistor 41C and is also supplied with the signal SIGC, while having the negative input terminal that is coupled to the positive input terminal of the amplifier 43A and to the resistor 41A and is also supplied with the signal SIGA.

This configuration causes the amplifier 43A to output a signal corresponding to a difference AB between the signals SIGA and SIGB (SIGA−SIGB), causes the amplifier 439 to output a signal corresponding to a difference BC between the signals SIGB and SIGC (SIGB−SIGC), and causes the amplifier 43C to output a signal corresponding to a difference CA between the signals SIGC and SIGA (SIGC−SIGA).

FIG. 10 illustrates an example of each of the signals SIGA to SIGC received by the receiver 40. In this example, the receiver 40 receives the six symbols "+x", "−y", "−z", "+z", "+y", and "−x" in this order. At this time, a voltage of the signal SIGA changes in such a manner as VH, VM, VH, VL, VM, and VL. A voltage of the signal SIGB changes in such a manner as VL, VL, VM, VM, VH, and VH. A voltage of the signal SIGC changes in such a manner as VM, VH, VL, VH, VL, and VM. Each of the differences AB, BC, and CA also changes accordingly. For example, the difference AB changes in such a manner as $+2\Delta V$, $+\Delta V$, $+\Delta V$, $-\Delta V$, $-\Delta V$, and $-2\Delta V$. The difference BC changes in such a manner as $-\Delta V$, $-2\Delta V$, $+\Delta V$, $-\Delta V$, $+2\Delta V$, and $+\Delta V$. The difference CA changes in such a manner as $-\Delta V$, $+\Delta V$, $-2\Delta V$, $+2\Delta V$, $-\Delta V$, and $-\Delta V$. Here, $-\Delta V$ is a difference between two adjacent voltages among the three voltages (the high-level voltage VH, the medium-level voltage VM, and the low-level voltage VL). The amplifiers 43A, 43B, and 43C each perform an operation in accordance with such differences AB, BC, and CA.

The clock generator 44 generates the clock signal RxCK on the basis of the output signal from each of the amplifiers 43A, 43B, and 43C.

The flip-flop 45 delays the output signal from each of the amplifiers 43A, 43B, and 43C by one clock period behind the clock signal RxCK, and outputs each delayed output signal. The flip-flop 46 delays each of the three output signals from the flip-flop 45 by one clock period behind the clock signal RxCK, and outputs each delayed output signal.

The signal generator 47 generates the transition signals RxF, RxR, and RxP on the basis of the output signal from each of the flip-flops 45 and 46 and the clock signal RxCK. The transition signals RxF, RxR, and RxP correspond, respectively, to the transition signals TxF9, TxR9, and TxP9 in the transmission device 10 (FIG. 4), and each represent the transition of the symbol. The signal generator 47 identifies the transition of the symbol (FIG. 3) on the basis of the symbol indicated by the output signal from the flip-flop 45 and the symbol indicated by the output signal from the flip-flop 46, and generates the transition signals RxF, RxR, and RxP.

The processor 32 (FIG. 1) performs predetermined processing on the basis of the transition signals RxF, RxR, and RxP and the clock signal RxCK.

Here, the driver section 29A corresponds to a specific example of a "first driver section" in the disclosure. The driver section 29B corresponds to a specific example of a "second driver section" in the disclosure. The driver section 29C corresponds to a specific example of a "third driver section" in the disclosure. The transition detector 25, the timing controller 27T, and the impedance controllers 28A to 28C correspond to a specific example of a "setting section" in the disclosure.

Workings and Effects

Workings and effects of the communication system 1 according to the present embodiment is subsequently described.

[Overview of Overall Operation]

First, an overview of an overall operation of the communication system 1 is described with reference to FIGS. 1, 4, and 7. The clock generator 11 in the transmission device 10 generates the clock signal TxCK. The processor 12 generates the transition signals TxF0 to TxF6, TxR0 to TxR6, and TxP0 to TxP6 by performing the predetermined processing. In the transmitter 20 (FIG. 4), the serializer 21F generates the transition signal TxF9 on the basis of the transition signals TxF0 to TxF6 and the clock signal TxCK. The serializer 21R generates the transition signal TxR9 on the basis of the transition signals TxR0 to TxR6 and the clock signal TxCK. The serializer 21P generates the transition signal TxP9 on the basis of the transition signals TxP0 to TxP6 and the clock signal TxCK. The transmission symbol generator 22 generates the symbol signals Tx1, Tx2, and Tx3 on the basis of the transition signals TxF9, TxR9, and TxP9 and the clock signal TxCK. The transition detector 25 generates the impedance control signal CTL on the basis of the transition signals TxF9, TxR9, and TxP9.

In the output section 26 (FIG. 7), the driver controller 27 generates the signals PUA, PDA, PUB, PDB, PUC, and PDC on the basis of the symbol signals Tx1, Tx2, and Tx3 and the clock signal TxCK. The timing controller 27T generates the impedance control signal CTL2 by performing timing adjustment of the impedance control signal CTL on the basis of the impedance control signal CTL and the clock signal TxCK. The impedance controller 28A generates the signals PUA1 to PUA24 and PDA1 to PDA24 on the basis of the signals PUA and PDA and the impedance control signal CTL2. The impedance controller 28B generates the signals PUB1 to PUB24 and PDB1 to PDB24 on the basis of the signals PUB and PDB and the impedance control signal CTL2. The impedance controller 28C generates the signals PUC1 to PUC24 and PDC1 to PDC24 on the basis of the signals PVC and PDC and the impedance control signal CTL2. The driver section 29A generates the signal SIGA on the basis of the signals PUA1 to PUA24 and PDA1 to PDA24. The driver section 29B generates the signal SIGB on the basis of the signals PUB1 to PUB24 and PDB1 to PDB24. The driver section 29C generates the signal SIGC on the basis of the signals PUC1 to PUC24 and PDC1 to PDC24.

In the reception device 30 (FIG. 1), the receiver 40 receives the signals SIGA, SIGB, and SIGC, and also generates the transition signals RxF, RxR, and RxP and the clock signal RxCK on the basis of these signals SIGA, SIGB, and SIGC. The processor 32 performs the predetermined processing on the basis of the transition signals RxF, RxR, and RxP and the clock signal RxCK.

(Detailed Operation)

Next, an operation of the transmission device 10 is described in detail. In the transmission device 10, the transition detector 25 generates the impedance control signal CTL on the basis of the transition signals TxF9, TxR9, and TxP9. Specifically, the transition detector 25 confirms, on the basis of whether or not the transition signals TxF9, TxR9, and TxP9 are "1xx", whether or not one of the signals SIGA, SIGB, and SIGC maintains the medium-level voltage VM when the symbol transitions. Then, the impedance controller 28A sets a higher output impedance for the driver section 29A in a case where the signal SIGA maintains the medium-level voltage VM when the symbol transitions. The impedance controller 28B sets a higher output impedance for the driver section 29B in a case where the signal SIGB maintains the medium-level voltage VM. The impedance controller 28C sets a higher output impedance for the driver section 29C in a case where the signal SIGC maintains the medium-level voltage VM.

FIGS. 11A to 11E each illustrate an example of the operation of the transmission device 10 in a case where the symbol transitions from "+x" to any of the symbols other than "+x". FIG. 11A illustrates a case where the symbol transitions from "+x" to "−x". FIG. 11B illustrates a case where the symbol transitions from "+x" to "+y". FIG. 11C illustrates a case where the symbol transitions from "+x" to "−y", FIG. 11D illustrates a case where the symbol transitions from "+x" to "+z", FIG. HE illustrates a case where the symbol transitions from "+x" to "−z".

As illustrated in FIG. 5, in a case where the symbol DS is "+x" and the transition signals TxF9, TxR9, and TxP9 are "1xx", the symbol transitions from "+x" to "−x". This, as illustrated in FIG. 11A, causes the signal SIGA to change from the high-level voltage VH to the low-level voltage VL, causes the signal SIGB to change from the low-level voltage VL to the high-level voltage VH, and causes the signal SIGC to maintain the medium-level voltage VM. At this time, as illustrated in FIG. 5, the transition detector 25 sets the impedance control signal CTL to "1" (active). Thus, the impedance controller 28C, during a period (unit interval UI) in which the transmission device 10 outputs the symbol "−x", sets the output impedance of the driver section 29C to about 500 [Ω] (W2 in FIG. 11A). In other words, when the symbol transitions from "+x" to "−x", the signal SIGC maintains the medium-level voltage VM, thus causing the impedance controller 28C to change the output impedance of the driver section 29C to a larger value (in this example, about 500 [Ω]).

FIG. 12 schematically illustrates an example of the operation of the communication system 1 in a case where the transmission device 10 is transmitting the symbol "−x" subsequent to the symbol "+x". This FIG. 12 illustrates each of the driver sections 29A, 29B, and 29C, using an equivalent circuit. In this example, the driver section 29A outputs the low-level voltage VL, the driver section 29B outputs the high-level voltage VH, and the driver section 29C outputs the medium-level voltage VM. At this time, the output impedance of the driver section 29C is set to a larger value, thus causing the driver section 29C to pull up the output terminal ToutA through a 1000-[Ω] resistor and to also pull down the output terminal ToutA through a 1000-[Ω] resistor. Thus, in the driver section 29C, a direct current IM is caused to flow via these two resistors. In this manner, in the transmission device 10, a higher output impedance is set for one of the driver sections 29A, 29B, and 29C which outputs the medium-level voltage VM, thus making it possible to suppress a current value of the direct current IM and thereby reduce power consumption.

In addition, in a case where the symbol DS is "+x" and the transition signals TxF9, TxR9, and TxP9 are "010", the symbol transitions from "+x" to "+y". This, as illustrated in FIG. 11B, causes the signal SIGA to change from the high-level voltage VH to the medium-level voltage VM, causes the signal SIGB to change from the low-level voltage VL to the high-level voltage VH, and causes the signal SIGC to change from the medium-level voltage VM to the low-level voltage VL. At this time, as illustrated in FIG. 5, the transition detector 25 sets the impedance control signal CTL to "0" (inactive). Thus, the impedance controller 28A, during a period when the transmission device 10 outputs the symbol "+y", sets the output impedance of the driver section 29A to about 50 [Ω]. In other words, the signal SIGA changes from the high-level voltage VH to the medium-level voltage VM, thus causing the impedance controller 28A to match the Output impedance of the driver section 29A to the characteristic impedance of the line 110A.

In addition, in a case where the symbol DS is "+x" and the transition signals TxF9, TxR9, and TxP9 are "011", the symbol transitions front "+x" to "−y". This, as illustrated in FIG. 11C, causes the signal SIGA to change from the high-level voltage VH to the medium-level voltage VM, causes the signal SIGB to maintain the low-level voltage VL, and causes the signal SIGC to change from the medium-level voltage VM to the high-level voltage VH. At this time, as illustrated in FIG. 5, the transition detector 25 sets the impedance control signal CTL to "0" (inactive). Thus, the impedance controller 28A, during a period when the transmission device 10 outputs the symbol "−y", sets the output impedance of the driver section 29A to about 50 [Ω]. In other words, the signal SIGA changes from the high-level voltage VH to the medium-level voltage VM, thus causing the impedance controller 28A to match the output impedance of the driver section 29A to the characteristic impedance of the line 110A.

In addition, in a case where the symbol DS is "+x" and the transition signals TxF9, TxR9, and TxP9 are "000", the symbol transitions from "+x" to "+z". This, as illustrated in FIG. 11D, causes the signal SIGA to change from the high-level voltage VH to the low-level voltage VL, causes the signal SIGB to change from the low-level voltage VL to the medium-level voltage VM, and causes the signal SIGC to change from the medium-level voltage VM to the high-level voltage VH. At this time, as illustrated in FIG. 5, the transition detector 25 sets the impedance control signal CTL to "0" (inactive). Accordingly, the impedance controller 28B, during a period when the transmission device 10 outputs the symbol "+z", sets the output impedance of the driver section 29B to about 50 [Ω]. In other words, the signal SIGB changes from the low-level voltage VL to the medium-level voltage VM, thus causing the impedance controller 283 to match the output impedance of the driver section 293 to the characteristic impedance of the line 110B.

In addition, in a case where the symbol DS is "+x" and the transition signals TxF9, TxR9, and TxP9 are "001", the symbol transitions from "+x" to "−z". This, as illustrated in FIG. 11E, causes the signal SIGA to maintain the high-level voltage VH, causes the signal SIGB to change from the low-level voltage VL to the medium-level voltage VM, and causes the signal SIGC to change from the medium-level voltage VM to the low-level voltage VL. At this time, as illustrated in FIG. 5, the transition detector 25 sets the impedance control signal CTL to "0" (inactive). Thus, the impedance controller 28B, during a period when the transmission device 10 outputs the symbol "−z", sets the output impedance of the driver section 29B to about 50 [Ω]. In other words, the signal SIGB changes from the low-level voltage VL to the medium-level voltage VM, thus causing the impedance controller 28B to match the output impedance of the driver section 29B to the characteristic impedance of the line 110B.

It is to be noted that, in this example, cases where the symbol transitions from "+x" to any of the symbols other than "+x" have been described. However, the same applies to any of cases where the symbol transitions from "−x" to any of the symbols other than "−x", the symbol transitions from "+y" to any of the symbols other than "+y", the symbol transitions from "−y" to any of the symbols other than "−y", the symbol transitions from "+z" to any of the symbols other than "+z", and the symbol transitions from "−z" to any of the symbols other than "−z".

In this manner, the communication system 1 omits the terminating resistor from the reception device 30, thus making it possible to reduce power consumption. In other words, in the receiver 40 (FIG. 9), for example, in a case of turning on the switches 42A to 42C and thereby causing each of the resistors 41A to 41C to function as the terminating resistor, a current is caused to flow, via the resistors 41A to 41C in the receiver 40, from a driver that is one of the driver sections 29A to 29C and generates the high-level voltage VH to a driver that generates the low-level voltage VL, thus resulting in an increase in power consumption. Meanwhile, in the communication system 1, the switches 42A to 42C are turned off and therefore such a current path does not occur, thus making it possible to reduce power consumption.

In addition, in the communication system 1, for example, in a case where the signal SIGA maintains the medium-level voltage VM when the symbol transitions, the impedance controller 28A sets a higher output impedance for the driver section 29A. This allows the communication system 1 to reduce power consumption while suppressing deterioration in waveform quality. In other words, for example, in a case where the signal SIGA maintains the medium-level voltage VM when the symbol transitions, the signal SIGA has not changed, which is therefore not likely to cause deterioration in waveform quality even when the output impedance of the driver section 29A does not match the characteristic impedance of the line 110A. Thus, in such a case, a higher output impedance is set for the driver section 29A, thus making it possible to reduce power consumption while suppressing deterioration in waveform quality.

In addition, in the communication system 1, the transition detector 25 detects a specific symbol transition on the basis of the transition signals TxF9, TxR9, and TxP9, and each of the impedance controllers 28A, 28B, and 28C sets the output impedance of a corresponding one of the driver sections 29A, 29B, and 29C on the basis of a result of the detection. This enables the communication system 1, for example, to dynamically set a higher output impedance only for a symbol transition that allows for suppression of deterioration in waveform quality even when the output impedance is set higher, thus making it possible to reduce power consumption while suppressing deterioration in waveform quality.

FIG. 13A illustrates an eye diagram (simulation result) of, in the communication system 1, the difference AB between the signals SIGA and SIGB, the difference BC between the signals SIGB and SIGC, and the difference CA between the signals SIGC and SIGA. FIG. 13B illustrates an eye diagram of the difference. AB, the difference BC, and the difference CA in a communication system 1R according to a comparative example. The communication system 1R is configured not to set a higher output impedance for the driver sections 29A, 29B, and 29C.

It is possible for the communication system 1 according to the present embodiment (FIG. 13A), as compared with the case of the communication system 1R according to the comparative example (FIG. 13B), to ensure a sufficient eye opening although the eye opening is slightly narrower. In addition, it is possible for the communication system 1, as compared with the communication system 1R according to the comparative example, to reduce power consumption related to the direct current IM by, for example, about 20%. In this manner, the communication system 1 allows for reduction in power consumption while suppressing deterioration in waveform quality.

Effects

As described above, in the present embodiment, a higher output impedance is set for a driver section in a case where the output signal from the driver section maintains the medium-level voltage when the symbol transitions, thus making it possible to reduce power consumption while suppressing deterioration in waveform quality.

According to the present embodiment, the transition detector detects the specific symbol transition on the basis of the transition signal, and the impedance controller sets the output impedance of the driver section on the basis of the result of the detection, thus making it possible to reduce power consumption while suppressing deterioration in waveform quality.

Modification Example 1-1

In the foregoing embodiment, twenty transistors 91 are turned on to thereby generate the high-level voltage VH; however, this is not limitative. For example, due to variation in elements at the time of manufacturing, in a case where the sum of the on-resistance of the transistor 91 and the resistance value of the resistor 92 is smaller than 1000 [Ω], the number of the transistors 91 to be turned on may be reduced. In addition, in a case where the sum of the on-resistance of the transistor 91 and the resistance value of the resistor 92 is larger than 1000 [Ω], the number of the transistors 91 to be turned on may be increased. The same applies to the case of generating the low-level voltage VL.

Modification Example 1-2

In the foregoing embodiment, ten transistors 91 and ten transistors 94 are turned on to thereby generate the medium-level voltage VM; however, this is not limitative. For example, due to variation in elements at the time of manufacturing, in a case where the sum of the on-resistance of the transistor 91 and the resistance value of the resistor 92 is smaller than the sum of the on-resistance of the transistor 94 and the resistance value of the resistor 93, the number of the transistors 91 to be turned on may be smaller than the number of the transistors 94 to be turned on. In addition, in a case where the sum of the on-resistance of the transistors 91 and the resistance value of the resistor 92 is larger than the sum of the on-resistance of the transistor 94 and the resistance value of the resistor 93, the number of the transistors 91 to be turned on may be larger than the number of the transistors 94 to be turned on. This allows the medium-level voltage VM to be closer to an intermediate voltage between the high-level voltage VH and the low-level voltage VL.

2. SECOND EMBODIMENT

Next, a communication system 2 according to a second embodiment is described. In the present embodiment, for all of the symbol transitions, a higher output impedance is set for the driver section that outputs the medium-level voltage VM. It is to be noted that the same reference numerals are assigned to substantially the same components as those in the communication system 1 according to the foregoing first embodiment, and the descriptions thereof are omitted where appropriate.

As illustrated in FIG. 1, the communication system 2 includes a transmission device 50. The transmission device 50 includes a transmitter 60.

FIG. 14 illustrates a configuration example of the transmitter 60. The transmitter 60 includes serializers 21F, 21R, and 21P, a transmission symbol generator 22, and an output section 66. In other words, the transmitter 60 according to the present embodiment omits the transition detector 25 from the transmitter 20 according to the first embodiment (FIG. 4), with the output section 26 being replaced by the output section 66.

FIG. 15 illustrates a configuration example of the output section 66. The output section 66 includes the driver controller 27, a control signal generator 67C, the impedance controllers 28A, 28B, and 28C, and the driver sections 29A, 29B, and 29C.

The control signal generator 67C generates an impedance control signal CTL3 on the basis of the clock signal TxCK. Then, the control signal generator 67C supplies the generated impedance control signal CTL3 to the impedance controllers 28A to 28C.

FIG. 16 illustrates an example of a waveform of each of the signals PUA and PDA and the impedance control signal CTL3 to be supplied to the impedance controller 28A. In this example, at timing t11, the signal PUA changes from low level to high level ((A) of FIG. 16), and the signal PDA changes from high level to low level at timing t13 at which time equivalent to two unit intervals UI has elapsed from the timing t11 ((B) of FIG. 16). Then, the impedance control signal CTL3 changes from low level to high level at a timing at which time equivalent to half the unit interval UI (0.5 UI) has elapsed from the timing t11, and changes from high level to low level at timing t12 at which time equivalent to half the unit interval UI has elapsed from the timing ((C) of FIG. 16). Likewise, the impedance control signal CTL3 changes from low level to high level at a timing at which time equivalent to half the unit interval UI (0.5 UI) has elapsed from the timing t12, and changes from high level to low level at the timing t13 at which time equivalent to half the unit interval UI has elapsed from the timing. Although, in this example, the signals to be supplied to the impedance controller 28A have been described, the same applies to the signals to be supplied to the impedance controllers 28B and 28C. In this manner, the control signal generator 67C generates the impedance control signal CTL3 that becomes "1" (active) in a latter half of the unit interval UI.

Here, the control signal generator 67C and the impedance controllers 28A to 28C correspond to a specific example of the "setting section" in the disclosure.

FIGS. 17A to 17E each illustrate an example of an operation of the transmission device 50 in a case where the symbol transitions from "+x" to any of the symbols other than "+x".

As illustrated in FIG. 5, in a case where the symbol DS is "+x" and the transition signals TxF9, TxR9, and TxP9 are "1xx", the symbol transitions from "+x" to "−x". At this time, as illustrated in FIG. 17A, the impedance controller 28C sets the output impedance of the driver section 29C to about 500 [Ω] in a latter half period (0.5 UI) of a period (unit interval UI) in which the transmission device 50 outputs the symbol "−x" (W31 in FIG. 17A). In other words, the signal SIGC has the medium-level voltage VM, thus causing the impedance controller 28C to change the output impedance of the driver section 29C to a larger value (in this example, about 500 [Ω]).

In addition, in a case where the symbol DS is "+x" and the transition signals TxF9, TxR9, and TxP9 are "010", the symbol transitions from "+x" to "+y". At this time, as illustrated in FIG. 17B, the impedance controller 28A sets the output impedance of the driver section 29A to about 500 [Ω] in the latter half period (0.5 UI) of a period in which the transmission device 50 outputs the symbol "+y" (W32 in FIG. 17B). In other words, the signal SIGA has the medium-level voltage VM, thus causing the impedance controller 28A to change the output impedance of the driver section 29A to a larger value (in this example, about 500 [Ω]).

In addition, in a case where the symbol DS is "±x" and the transition signals TxF9, TxR9, and TxP9 are "011", the symbol transitions from "+x" to "−y". At this time, as illustrated in FIG. 17C, the impedance controller 28A sets the output impedance of the driver section 29A to about 500 [Ω] in the latter half period (0.5 UI) of a period in which the transmission device 50 outputs the symbol "−y" (W33 in FIG. 17C). In other words, the signal SIGA has the medium-level voltage VM, thus causing the impedance controller 28A to change the output impedance of the driver section 29A to a larger value (in this example, about 500 [Ω]).

In addition, in a case where the symbol DS is "+x" and the transition signals TxF9, TxR9, and TxP9 are "000", the symbol transitions from "+x" to "+z". At this time, as illustrated in FIG. 17D, the impedance controller 28B sets the output impedance of the driver section 29B to about 500 [Ω] in the latter half period (0.5 UI) of a period in which the transmission device 50 outputs the symbol "+z" (W34 in FIG. 17D). In other words, the signal SIGB has the medium-level voltage VM, thus causing the impedance controller 28B to change the output impedance of the driver section 29B to a larger value (in this example, about 500 [Ω]).

In addition, in a case where the symbol DS is "+x" and the transition signals TxF9, TxR9, and TxP9 are "001", the symbol transitions from "+x" to "−z". At this time, as illustrated in FIG. 17E, the impedance controller 28B sets the output impedance of the driver section 29B to about 500 [Ω] in the latter half period (0.5 UI) of a period in which the transmission device 50 outputs the symbol "−z" (W35 in FIG. 17E). In other words, the signal SIGB has the medium-level voltage VM, thus causing the impedance controller 28B to change the output impedance of the driver section 299 to a larger value (in this example, about 500 [Ω]).

FIG. 18 illustrates an eye diagram of, in the communication system 2, the difference AB between the signals SIGA and SIGB, the difference BC between the signals SIGB and SIGC, and the difference CA between the signals SIGC and SIGA. It is possible for the communication system 2 according to the present embodiment (FIG. 18), as compared with the case of the communication system 1 according to the first embodiment (FIG. 13A), to provide a wider eye opening. In addition, it is possible for the communication system 2, as compared with the communication system 1R according to the comparative example, to reduce power consumption related to the direct current IM by, for example, about 50%. In this manner, in the communication system 2, for all of the symbol transitions, a higher output impedance is set, only during a predetermined period (in this example, 0.5 UI), for one of the driver sections 29A, 29B, and 29C which outputs the medium-level voltage VM, thus making it possible to reduce power consumption while suppressing deterioration in waveform quality.

In addition, in the communication system 2, for all of the symbol transitions, a higher output impedance is set for one of the driver sections 29A, 29B, and 29C which outputs the medium-level voltage VM. This makes it possible to omit the transition detector 25 in the foregoing first embodiment, thus allowing for a simple configuration.

As described above, in the present embodiment, for all of the symbol transitions, a higher output impedance is set, only during a predetermined period, for the driver section that outputs the medium-level voltage, thus making it possible to reduce power consumption while suppressing deterioration in waveform quality.

In the present embodiment, for all of the symbol transitions, a higher output impedance is set for the driver section at outputs the medium-level voltage, thus allowing for a simple configuration.

Other effects are similar to those in the case of the foregoing first embodiment.

Modification Example 2-1

In the foregoing embodiment, the impedance control signal CTL3, as illustrated in FIG. 16, for example, changes from low level to high level at a timing at which time equivalent to half the unit interval UI (0.5 UI) has elapsed from the timing t11, and changes from high level to low level at the timing t12 when time equivalent to half the unit interval UI has elapsed from the timing. However, this is not limitative. Alternatively, for example, the impedance control signal CTL3 may change from low level to high level at a timing at which time shorter than half the unit interval UI has elapsed from the timing t11, and change from high level to low level at the timing t12. In this case, it is possible to increase a length of the period during which a higher impedance is set for one of the driver sections 29A, 29B, and 29C which outputs the medium-level voltage VM. This, as a result, makes it possible to further reduce power consumption. In addition, for example, the impedance control signal CTL3 may change from low level to high level at a timing at which time longer than half the unit interval UI has elapsed from the timing t11, and change from high level to low level at the timing t12.

3. THIRD EMBODIMENT

Next, a communication system 3 according to a third embodiment is described. According to the present embodiment, a specific symbol transition with which a higher output impedance is set is determined, while focusing on a transition time of each of the differences AB, BC, and CA at a time when the symbol transitions. It is to be noted that the same reference numerals are assigned to substantially the same components as those in the communication system 1 according to the foregoing first embodiment, and the descriptions thereof are omitted where appropriate.

As illustrated in FIG. 1, the communication system 3 includes a transmission device 70. The transmission device 70 includes a transmitter 80. As illustrated in FIG. 4, the transmitter 80 includes a transition detector 85.

FIG. 19 illustrates an example of an operation of the transition detector 85. The transition detector 85, as indicated by W4 in FIG. 19, sets the impedance control signal CTL to "1" (active) in cases where the transition signals TxF9, TxR9, and TxP9 are "001", "011", and "1xx", and sets the impedance control signal CTL to "0" (inactive) in other cases. The transition detector 85 confirms, on the basis of the transition signals TxF9, TxR9, and TxP9, whether or not the symbol transition is a symbol transition in which one of the differences AB, BC, and CA may take a longer transition time, and generates the impedance control signal CTL on the basis of the result.

FIG. 20 schematically illustrates an eye diagram of differences AB, BC, and CA. As illustrated in FIG. 20, transitions W61 and W62 are each a transition that takes longer transition time as compared with other transitions. The transition W61 is a transition changing from $-2\Delta V$ to $+\Delta V$, and the transition W62 is a transition changing from $+2\Delta V$ to $\Delta V$.

The transition detector 85 confirms, on the basis of the transition signals TxF9, TxR9, and TxP9, whether or not the symbol transition, as with the transitions W61 and W62, is the symbol transition in which one of the differences AB, BC, and CA may take a longer transition time. Then, in a case where the transition signals TxF9, TxR9, and TxP9 are "000" or "010", the transition detector 85 determines that the symbol transition is the symbol transition in which one of the differences AB, BC, and CA may take a longer transition time, and sets the impedance control signal CTL to "0" (inactive). In addition, in a case where the transition signals TxF9, TxR9, and TxP9 are "001", "011", or "1xx", the transition detector 85 determines that the symbol transition is not the symbol transition in which one of the differences AB, BC, and CA may take a longer transition time, and sets the impedance control signal CTL to "1" (active).

Here, the transition detector 85, the timing controller 27T, and the impedance controllers 28A to 28C correspond to a specific example of the "setting section" in the disclosure.

FIGS. 21A to 21E each illustrate an example of an operation of the transmission device 70 in a case where the symbol transitions from "+x" to any of the symbols other than "+x".

As illustrated in FIG. 19, in a case where the symbol DS is "+x" and the transition signals TxF9, TxR9, and TxP9 are "1xx", the symbol transitions from "+x" to "−x". At this time, as illustrated in FIG. 19, the transition detector 85 sets the impedance control signal CTL to "1" (active). Thus, as illustrated in FIG. 21A, the impedance controller 28C sets the output impedance of the driver section 29C to about 500 [Ω] during a period (unit interval UI) in which the transmission device 70 outputs the symbol "−x" (W51 in FIG. 21A). In other words, in a case where the symbol transitions from "+x" to "−x", none of the differences AB, BC, and CA correspond to W61 or W62, thus causing the impedance controller 28C to change the output impedance of the driver section 29C to a larger value (in this example, about 500 [Ω]).

In addition, in a case where the symbol DS is "+x" and the transition signals TxF9, TxR9, and TxP9 are "010", the symbol transitions from "+x" to "+y". At this time, as illustrated in FIG. 19, the transition detector 85 sets the impedance control signal CTL to "0" (inactive). Thus, as illustrated in FIG. 21B, the impedance controller 28A sets the output impedance of the driver section 29A to about 50 [Ω] during a period in which the transmission device 70 outputs the symbol "+y". In other words, the transition of the difference AB corresponds to the transition W62, in which the difference AB may take a longer transition time, thus causing the impedance controller 28A to match, without setting to a larger value, the output impedance of the driver section 29A to the characteristic impedance of the line 110A. This makes it possible to reduce the transition time of the signal SIGA as compared with the case of setting the output impedance of the driver section 29A to a larger value, thus making it possible to reduce the possibility that the difference AB may take a longer transition time.

In addition, in a case where the symbol DS is "+x" and the transition signals TxF9, TxR9, and TxP9 are "011", the symbol transitions from "+x" to "−y". At this time, as illustrated in FIG. 19, the transition detector 85 sets the impedance control signal CTL to "1" (active). Thus, as illustrated in FIG. 21C, the impedance controller 284 sets the output impedance of the driver section 29A to about 500 [Ω] during a period in which the transmission device 70 outputs the symbol "−y" (W52 in FIG. 21C). In other words, in a case where the symbol transitions from "+x" to "−y", none of the transitions of the differences AB, BC, and CA correspond to the transition W61 or W62, thus causing the impedance controller 28A to change the output impedance of the driver section 29A to a larger value (in this example, about 500 [Ω]).

In addition, in a case where the symbol DS is "+x" and the transition signals TxF9, TxR9, and TxP9 are "000", the symbol transitions from "+x" to "+z". At this time, as illustrated in FIG. 19, the transition detector 85 sets the impedance control signal CTL to "0" (inactive). Thus, as illustrated in FIG. 21D, the impedance controller 28B sets the output impedance of the driver section 29B to about 50 [Ω] during a period in which the transmission device 70 outputs the symbol "+z". In other words, the transition of the difference AB corresponds to the transition W62, in which the difference AB may take a longer transition time, thus causing the impedance controller 28B to match, without setting to a larger value, the output impedance of the driver section 29B to the characteristic impedance of the line 110B. This makes it possible to reduce the transition time of the signal SIGB as compared with the case of setting the output impedance of the driver section 29B to a larger value, thus making it possible to reduce the possibility that the difference AB may take a longer transition time.

In addition, in a case where the symbol DS is "±x" and the transition signals TxF9, TxR9, and TxP9 are "001", the symbol transitions from "+x" to "−z". At this time, as illustrated in FIG. 19, the transition detector 85 sets the impedance control signal CTL to "1" (active). Thus, as illustrated in FIG. 21E, the impedance controller 28B sets the output impedance of the driver section 29B to about 500 [Ω] during a period in which the transmission device 70 outputs the symbol "−z" (W53 in FIG. 21E). In other words, in a case where the symbol transitions from "+x" to "−z", none of the transitions of the differences AB, BC, and CA correspond to the transition W61 or W62, thus causing the impedance controller 28B to change the output impedance of the driver section 29B to a larger value (in this example, about 500 [Ω]).

FIG. 22 illustrates an eye diagram of, in the communication system 3, the difference AB between the signals SIGA and SIGB, the difference BC between the signals SIGB and SIGC, and the difference CA between the signals SIGC and SIGA. The communication system 3 according to the present embodiment (FIG. 22) allows for obtainment of an eye opening equivalent to the eye opening in the communication system 1 according to the first embodiment (FIG. 13A). In addition, the communication system 3, as compared with the communication system 1R according to the comparative example, allows for reduction in power consumption related to the direct current IM by, for example, about 60%. In this manner, in the communication system 3, in a case where the symbol transition is not the symbol transition in which one of the differences AB, BC, and CA may take a longer transition time, a higher output impedance is set for one of the driver sections 29A, 29B, and 29C which outputs the medium-level voltage VM, thus making it possible to reduce power consumption while suppressing deterioration in waveform quality.

As described above, in the present embodiment, in a case where the symbol transition is not the symbol transition in which one of the differences AB, BC, and CA may take a longer transition time, a higher output impedance is set for the driver section that outputs the medium-level voltage, thus making it possible to reduce power consumption while suppressing deterioration in waveform quality.

4. APPLICATION EXAMPLES

Description is given next of application examples of the communication systems that have been described in the foregoing embodiments and modification examples.

Application Example 1

FIG. 23 illustrates an appearance of a smartphone 300 (a multi-functional mobile phone) to which the communication system according to any of the foregoing embodiments, etc. is applied. Various devices are mounted in the smartphone 300. The communication system according to any of the foregoing embodiments, etc. is applied to a communication system that exchanges data between these devices.

FIG. 24 illustrates a configuration example of an application processor 310 used in the smartphone 300. The application processor 310 includes a central processing unit (CPU) 311, a memory controller 312, a power supply controller 313, an external interface 314, a graphics processing unit (GPU) 315, a media processor 316, a display controller 317, and a mobile industry processor interface (MIPI) interface 318. In this example, the CPU 311, the memory controller 312, the power supply controller 313, the external interface 314, the GPU 315, the media processor 316, and the display controller 317 are coupled to a system bus 319 to allow for mutual data exchange via the system bus 319.

The CPU 311 processes various pieces of information handled in the smartphone 300 in accordance with a program. The memory controller 312 controls a memory 501 used at a time when the CPU 311 performs information processing. The power supply controller 313 controls a power supply of the smartphone 300.

The external interface 314 is an interface for communication with external devices. In this example, the external interface 314 is coupled to a wireless communication section 502 and an image sensor 410. The wireless communication section 502 performs wireless communication with mobile phone base stations. The wireless communication section 502 includes, for example, a baseband section, a radio frequency (RF) front end section, and other components. The image sensor 410 acquires an image, and includes, for example, a CMOS sensor.

The GPU 315 performs image processing. The media processor 316 processes information such as voice, letters, and graphics. The display controller 317 controls the display 504 via the MIPI interface 318. The MIPI interface 318 transmits an image signal to the display 504. As the image signal, for example, a YUV-format signal, an RGB-format signal, or any other format signal may be used. The MIPI interface 318 operates, on the basis of a reference clock supplied from an oscillator circuit 330 including a crystal resonator, for example. For example, the communication system according to any of the foregoing embodiments, etc. is applied to a communication system between the MIPI interface 318 and the display 504d.

FIG. 25 illustrates a configuration example of the image sensor 410. The image sensor 410 includes a sensor section 411, an image signal processor (ISP) 412, a joint photographic experts group (JPEG) encoder 413, a CPU 414, a random access memory (RAM) 415, a read only memory (ROM) 416, a power supply controller 417, an inter-integrated circuit ($I^2C$) interface 418, and an MIN interface 419. In this example, these blocks are coupled to a system bus 420 to allow for mutual data exchange via the system bus 420.

The sensor section 411 acquires an image, and is configured by, for example, a CMOS sensor. The ISP 412 performs predetermined processing on the image acquired by the sensor section 411. The JPEG encoder 413 encodes the image processed by the ISP 412 to generate a JPEG-format image. The CPU 414 controls respective blocks of the image sensor 410 in accordance with a program. The RAM 415 is a memory used at a time when the CPU 414 performs information processing. The ROM 416 stores a program to be executed in the CPU 414, a setting value obtained by calibration, and any other information. The power supply controller 417 controls a power supply of the image sensor 410. The $I^2C$ interface 418 receives a control signal from the application processor 310. Although not illustrated, the image sensor 410 also receives a clock signal from the application processor 310, in addition to the control signal. Specifically, the image sensor 410 is configured to be operable on the basis of clock signals of various frequencies. The MIPI interface 419 transmits an image signal to the application processor 310. As the image signal, for example, a YUV-format signal, an RGB-format signal, or any other format signal may be used. The MIPI interface 419 operates on the basis of a reference clock supplied from an oscillator circuit 430 including a crystal resonator, for example. For example, the communication system according to any of the foregoing embodiments, etc. is applied to a communication system between the MIPI interface 419 and the application processor 310.

Application Example 2

FIG. 26 illustrates a configuration example of a vehicle control system 600 to which the communication system according to any of the foregoing embodiments, etc. is applied. The vehicle control system 600 controls operations of an automobile, an electric vehicle, a hybrid electric vehicle, a two-wheeled vehicle, and the like. This vehicle control system 600 includes a driving system control unit 610, a body system control unit 620, a battery control unit 630, an outside-vehicle information detecting unit 640, an in-vehicle information detecting unit 650, and an integrated control unit 660. These units are coupled to one another via a communication network 690. As the communication network 690, for example, a network in conformity with any standard such as a controller area network (CAN), local interconnect network (LIN), local area network (LAN), and FlexRay (Registered Trademark) may be used. Each of the units includes, for example, a microcomputer, a storage section, a drive circuit that drives a device to be controlled, a communication I/F, and the like.

The driving system control unit 610 controls operations of devices related to a driving system of a vehicle. A vehicle state detecting section 611 is coupled to the driving system control unit 610. The vehicle state detecting section 611 detects a state of the vehicle. The vehicle state detecting section 611 includes a gyro sensor, an acceleration sensor, a sensor that detects an amount of operation of an accelerator pedal and a brake pedal or a steering angle, or any other sensor, for example. The driving system control unit 610 controls the operations of the devices related to the driving system of the vehicle on the basis of information detected by the vehicle state detecting section 611. For example, the communication system of any of the foregoing embodiments, etc. is applied to a communication system between the driving system control unit 610 and the vehicle state detecting section 611.

The body system control unit 620 controls operations of various devices mounted on the vehicle, such as a keyless entry system, a power window device, and various lamps.

The battery control unit 630 controls a battery 631. The battery 631 is coupled to the battery control unit 630. The battery 631 supplies power to a driving motor, and includes, for example, a secondary battery, a cooling system, and the like. The battery control unit 630 acquires information such as temperature, an output voltage, and a remaining battery amount from the battery 631, and controls the cooling system, etc. of the battery 631 on the basis of the information. For example, the communication system of any of the foregoing embodiments, etc. is applied to a communication system between the battery control unit 630 and the battery 631.

The outside-vehicle information detecting unit 640 detects information outside the vehicle. An imaging section 641 and an outside-vehicle information detecting section 642 are coupled to the outside-vehicle information detecting unit 640. The imaging section 641 captures an image outside the vehicle, and includes, for example, a time of flight (ToF) camera, a stereo camera, a monocular camera, an infrared camera, and the like. The outside-vehicle information detecting section 642 detects information outside the vehicle, and includes, for example, a sensor that detects weather and climate, a sensor that detects other vehicles around the vehicle, an obstacle, a pedestrian, etc., and any other sensor. The outside-vehicle information detecting unit 640 recognizes, for example, weather and climate, a road surface condition, etc. on the basis of the image acquired by the imaging section 641 as well as the information detected by the outside-vehicle information detecting section 642, and detects objects such as other vehicles around the vehicle, an obstacle, a pedestrian, a sign, and letters on a road, or detects a distance between the object and the vehicle. For example, the communication system of any of the foregoing embodiments, etc. is applied to a communication system between the outside-vehicle information detecting unit 640 and each of the imaging section 641 and the outside-vehicle information detecting section 642.

The in-vehicle information detecting unit 650 detects information inside the vehicle. A driver state detecting section 651 is coupled to the in-vehicle information detecting unit 650. The driver state detecting section 651 detects a state of a driver, and includes, for example, a camera, a biosensor, a microphone, and the like. The in-vehicle information detecting unit 650 monitors, for example, a degree of fatigue of the driver or a degree of concentration of the driver, whether the driver is dozing, and any other factor, on the basis of information detected by the driver state detecting section 651. For example, the communication system of any of the foregoing embodiments, etc. is applied to a communication system between the in-vehicle information detecting unit 650 and the driver state detecting section 651.

The integrated control unit 660 controls operations of the vehicle control system 600. An operating section 661, a display section 662, and an instrument panel 663 are coupled to the integrated control unit 660. An occupant operates the operating section 661. The operating section 661 includes, for example, a touch panel, various buttons, switches, and the like. The display section 662 displays an image, and is configured by, for example, a liquid crystal display panel, etc. The instrument panel 663 displays a state of the vehicle, and includes meters such as a speed meter, various warning lamps, and the like. For example, the communication system of any of the foregoing embodiments, etc. is applied to a communication system between the integrated control unit 660 and each of the operating section 661, the display section 662, and the instrument panel 663.

Although the technology has been described above referring to some embodiments and modification examples as well as application examples to electronic apparatuses, the technology is not limited to these embodiments, etc., and may be modified in a variety of ways.

For example, in each of the foregoing embodiments, etc., the switches 42A to 42C in the reception device 30 are turned off to thereby avoid using the terminating resistor. However, this is not limitative; alternatively, for example, the switches 42A to 42C may be turned on. In this case, setting a higher output impedance for the driver section that outputs the medium-level voltage VM also makes it possible to reduce power consumption.

It is to be noted that effects described herein are merely illustrative and are not limitative, and may have other effects.

It is to be noted that the technology may have the following configurations.

(1)

A transmission device including:

a first driver section that selectively sets a voltage at a first output terminal to one of a first voltage, a second voltage, and a third voltage, the third voltage being between the first voltage and the second voltage; and a setting section that dynamically sets an output impedance of the first driver section at a time when the first driver section sets the voltage at the first output terminal to the third voltage.

(2)

The transmission device according to (1), in which the first driver section changes the voltage at the first output terminal from one of the first voltage and the second voltage to the third voltage during a first period, and maintains the voltage at the first output terminal at the third voltage during a second period after the first period, and the setting section sets the output impedance of the first driver section during the second period to an impedance higher than the output impedance of the first driver section during the first period.

(3)

The transmission device according to (2), in which the first driver section sets the voltage at the first output terminal in a predetermined cycle, and a period corresponding to the predetermined cycle includes the first period and the second period.

(4)

The transmission device according to (2), in which the first driver section sets the voltage at the first output terminal to the third voltage a plurality of times consecutively in a predetermined cycle, and the second period is a period after a timing at which the first driver section sets the voltage at the first output terminal to the third voltage for a second time.

(5)

The transmission device according to any one of (2) to (4), in which the output impedance of the first driver section during the first period corresponds to the output impedance of the first driver section at a time when the first driver section sets the voltage at the first output terminal to one of the first voltage and the second voltage.

(6)

The transmission device according to (1), further including:

a second driver section that selectively sets a voltage at a second output terminal to one of the first voltage, the second voltage, and the third voltage; and a third driver section that selectively sets a voltage at a third output terminal to one of the first voltage, the second voltage, and the third voltage, in which the voltages at the first output terminal, the second output terminal, and the third output terminal differ from one another, and the setting section further dynamically sets an output impedance of the second driver section at a time when the second driver section sets the voltage at the second output terminal to the third voltage, and the setting section also dynamically sets an output impedance of the third driver section at a time when the third driver section sets the voltage at the third output terminal to the third voltage.

(7)

The transmission device according to (6), in which the first driver section, the second driver section, and the third driver section transmit a sequence of a symbol by setting the voltages at the first output terminal, the second output terminal, and the third output terminal, and the setting section sets, on a basis of a predetermined symbol transition in the sequence, the output impedances of the first driver section, the second driver section, and the third driver section.

(8)

The transmission device according to (7), further including a signal generator that generates a symbol signal on a basis of a transition signal indicating a transition of the symbol, in which the first driver section, the second driver section, and the third driver section set, on a basis of the symbol signal, respective voltages at the first output terminal, the second output terminal, and the third output terminal, and the setting section sets the output impedances of the first driver section, the second driver section, and the third driver section by detecting the predetermined symbol transition on a basis of the transition signal.

(9)

The transmission device according to (7) or (8), in which, in a symbol transition in which two of voltages of the first output terminal, the second output terminal, and the third output terminal change and one of the voltages is maintained at the third voltage, the setting section sets an output impedance of one of the first driver section, the second driver section, and the third driver section, higher than output impedances of the others of the first driver section, the second driver section; and the third driver section, the one of the first driver section, the second driver section, and the third driver section setting a corresponding output terminal to the third voltage.

(10)

The transmission device according to (7) or (8), in which, in a symbol transition in which two of voltages of the first output terminal, the second output terminal, and the third output terminal change and one of the voltage does not change, the setting section sets an output impedance of one of the first driver section, the second driver section, and the third driver section, higher than output impedances of the others of the first driver section, the second driver section, and the third driver section, the one of the first driver section, the second driver section, and the third driver section setting a corresponding output terminal to the third voltage.

(11)

The transmission device according to any one of (1) to (10), in which the first driver section includes a first circuit provided on a path from a first power supply to the first output terminal, and a second circuit provided on a path from a second power supply to the first output terminal, and the first driver section sets the voltage at the first output terminal to the third voltage by causing an electric current to flow from the first power supply to the second power supply via the first circuit and the second circuit.

(12)

The transmission device according to (11), in which the first circuit includes a plurality of first sub-circuits coupled to each other in parallel, the plurality of first sub-circuits each including a first resistor and a first transistor that are provided on the path from the first power supply to the first output terminal, the second circuit includes a plurality of second sub-circuits coupled to each other in parallel, the plurality of second sub-circuits each including a second resistor and a second transistor that are provided on the path from the second power supply to the first output terminal, and the voltage at the first output terminal is set to the third voltage by turning on the first transistor in one or more of the plurality of first sub-circuits and also turning on the second transistor in one or more of the plurality of second sub-circuits.

(13)

The transmission device according to (12), in which the setting section sets the output impedance of the first driver section by setting, among a plurality of the first transistors in the first circuit, the number of first transistors to be turned on and also setting, among a plurality of the second transistors in the second circuit, the number of second transistors to be turned on.

(14)

A transmission method including:

causing a first driver section to selectively set a voltage at a first output terminal to one of a first voltage, a second voltage, and a third voltage, the third voltage being between the first voltage and the second voltage; and dynamically setting an output impedance of the first driver section at a time when the first driver section sets the voltage at the first output terminal to the third voltage.

(15)

A communication system including:

a transmission device; and a reception device, the transmission device including a first driver section that selectively sets a voltage at a first output terminal to one of a first voltage, a second voltage, and a third voltage, the third voltage being between the first voltage and the second voltage, and a setting section that dynamically sets an output impedance of the first driver section at a time when the first driver section sets the voltage at the first output terminal to the third voltage.

(16)

The communication system according to (15), in which the reception device includes a terminating resistor that is coupled to an input terminal, the terminating resistor being settable active or inactive.

(17)

The communication system according to (16), in which the terminating resistor is set inactive.

This application claims the benefit of Japanese Priority Patent Application JP2016-010286 filed with the Japan Patent Office on Jan. 22, 2016, the entire contents of which are incorporated herein by reference.

It should be understood by those skilled in the art, that various modifications, combinations, sub-combinations, and alterations may occur depending on design requirements and other factors insofar as they are within the scope of the appended claims or the equivalents thereof.

The invention claimed is:

1. A transmission device comprising:
a first driver section that selectively sets a voltage at a first output terminal to one of a first voltage, a second voltage, and a third voltage, the third voltage being between the first voltage and the second voltage; and
a setting section that dynamically sets an output impedance of the first driver section at a time when the first driver section sets the voltage at the first output terminal to the third voltage.

2. The transmission device according to claim 1, wherein the first driver section changes the voltage at the first output terminal from one of the first voltage and the second voltage to the third voltage during a first period, and maintains the voltage at the first output terminal at the third voltage during a second period after the first period, and
the setting section sets the output impedance of the first driver section during the second period to an impedance higher than the output impedance of the first driver section during the first period.

3. The transmission device according to claim 2, wherein the first driver section sets the voltage at the first output terminal in a predetermined cycle, and
a period corresponding to the predetermined cycle includes the first period and the second period.

4. The transmission device according to claim 2, wherein the first driver section sets the voltage at the first output terminal to the third voltage a plurality of times consecutively in a predetermined cycle, and
the second period is a period after a timing at which the first driver section sets the voltage at the first output terminal to the third voltage for a second time.

5. The transmission device according to claim 2, wherein the output impedance of the first driver section during the first period corresponds to the output impedance of the first driver section at a time when the first driver section sets the voltage at the first output terminal to one of the first voltage and the second voltage.

6. The transmission device according to claim 1, further comprising:
a second driver section that selectively sets a voltage at a second output terminal to one of the first voltage, the second voltage, and the third voltage; and
a third driver section that selectively sets a voltage at a third output terminal to one of the first voltage, the second voltage, and the third voltage, wherein
the voltages at the first output terminal, the second output terminal, and the third output terminal differ from one another, and
the setting section further dynamically sets an output impedance of the second driver section at a time when the second driver section sets the voltage at the second output terminal to the third voltage, and
the setting section also dynamically sets an output impedance of the third driver section at a time when the third driver section sets the voltage at the third output terminal to the third voltage.

7. The transmission device according to claim 6, wherein the first driver section, the second driver section, and the third driver section transmit a sequence of a symbol by setting the voltages at the first output terminal, the second output terminal, and the third output terminal, and
the setting section sets, on a basis of a predetermined symbol transition in the sequence, the output impedances of the first driver section, the second driver section, and the third driver section.

8. The transmission device according to claim 7, further comprising a signal generator that generates a symbol signal on a basis of a transition signal indicating a transition of the symbol, wherein
the first driver section, the second driver section, and the third driver section set, on a basis of the symbol signal, respective voltages at the first output terminal, the second output terminal, and the third output terminal, and
the setting section sets the output impedances of the first driver section, the second driver section, and the third driver section by detecting the predetermined symbol transition on a basis of the transition signal.

9. The transmission device according to claim 7, wherein, in a symbol transition in which two of voltages of the first output terminal, the second output terminal, and the third output terminal change and one of the voltages is maintained at the third voltage, the setting section sets an output impedance of one of the first driver section, the second driver section, and the third driver section, higher than output impedances of the others of the first driver section, the second driver section, and the third driver section, the one of the first driver section, the second driver section, and the third driver section setting a corresponding output terminal to the third voltage.

10. The transmission device according to claim 7, wherein, in a symbol transition in which two of voltages of the first output terminal, the second output terminal, and the third output terminal change and one of the voltage does not change, the setting section sets an output impedance of one of the first driver section, the second driver section, and the third driver section, higher than output impedances of the others of the first driver section, the second driver section, and the third driver section, the one of the first driver section, the second driver section, and the third driver section setting a corresponding output terminal to the third voltage.

11. The transmission device according to claim 1, wherein the first driver section includes
a first circuit provided on a path from a first power supply to the first output terminal, and
a second circuit provided on a path from a second power supply to the first output terminal, and
the first driver section sets the voltage at the first output terminal to the third voltage by causing an electric current to flow from the first power supply to the second power supply via the first circuit and the second circuit.

12. The transmission device according to claim 11, wherein
the first circuit includes a plurality of first sub-circuits coupled to each other in parallel, the plurality of first sub-circuits each including a first resistor and a first transistor that are provided on the path from the first power supply to the first output terminal,
the second circuit includes a plurality of second sub-circuits coupled to each other in parallel, the plurality of second sub-circuits each including a second resistor and a second transistor that are provided on the path from the second power supply to the first output terminal, and
the voltage at the first output terminal is set to the third voltage by turning on the first transistor in one or more of the plurality of first sub-circuits and also turning on the second transistor in one or more of the plurality of second sub-circuits.

13. The transmission device according to claim 12, wherein the setting section sets the output impedance of the first driver section by setting, among a plurality of the first transistors in the first circuit, the number of first transistors to be turned on and also setting, among a plurality of the second transistors in the second circuit, the number of second transistors to be turned on.

14. A transmission method comprising:
causing a first driver section to selectively set a voltage at a first output terminal to one of a first voltage, a second voltage, and a third voltage, the third voltage being between the first voltage and the second voltage; and
dynamically setting an output impedance of the first driver section at a time when the first driver section sets the voltage at the first output terminal to the third voltage.

15. A communication system comprising:
a transmission device; and
a reception device,
the transmission device including
a first driver section that selectively sets a voltage at a first output terminal to one of a first voltage, a second voltage, and a third voltage, the third voltage being between the first voltage and the second voltage, and
a setting section that dynamically sets an output impedance of the first driver section at a time when the first driver section sets the voltage at the first output terminal to the third voltage.

16. The communication system according to claim 15, wherein the reception device includes a terminating resistor that is coupled to an input terminal, the terminating resistor being settable active or inactive.

17. The communication system according to claim 16, wherein the terminating resistor is set inactive.

* * * * *